(12) United States Patent
Wicker et al.

(10) Patent No.: US 10,518,490 B2
(45) Date of Patent: Dec. 31, 2019

(54) METHODS AND SYSTEMS FOR EMBEDDING FILAMENTS IN 3D STRUCTURES, STRUCTURAL COMPONENTS, AND STRUCTURAL ELECTRONIC, ELECTROMAGNETIC AND ELECTROMECHANICAL COMPONENTS/DEVICES

(71) Applicant: Board of Regents, The University of Texas System, Austin, TX (US)

(72) Inventors: Ryan B. Wicker, El Paso, TX (US); Francisco Medina, El Paso, TX (US); Eric MacDonald, El Paso, TX (US); Danny W. Muse, El Paso, TX (US); David Espalin, Sunland Park, NM (US)

(73) Assignee: Board of Regents, The University of Texas System, Austin, TX (US)

(*) Notice: Subject to any disclaimer, the term of this patent is extended or adjusted under 35 U.S.C. 154(b) by 968 days.

(21) Appl. No.: 13/829,723

(22) Filed: Mar. 14, 2013

(65) Prior Publication Data
US 2014/0268604 A1 Sep. 18, 2014

(51) Int. Cl.
*B29C 70/88* (2006.01)
*B29C 70/82* (2006.01)
(Continued)

(52) U.S. Cl.
CPC .......... *B29C 70/885* (2013.01); *B29C 70/82* (2013.01); *B33Y 10/00* (2014.12); *B33Y 30/00* (2014.12);
(Continued)

(58) Field of Classification Search
CPC ..... B29C 70/82; B29C 70/103; B29C 70/885; B29C 67/0051; H05K 3/103;
(Continued)

(56) References Cited

U.S. PATENT DOCUMENTS 2,431,393 A * 11/1947 Franklin ............... E04F 11/16
156/251
D269,984 S 8/1983 McKechnie
(Continued)

FOREIGN PATENT DOCUMENTS

JP 2007018467 U 3/1995
JP 2002270422 A 9/2002
(Continued)

OTHER PUBLICATIONS

Leigh et al., (2012) "A Simple, Low-Cost Conductive Composite Material for 3D Printing of Electronic Sensors". PLoS ONE 7(11): e49365. doi:10.1371/journal.pone.0049365.*
(Continued)

*Primary Examiner* — Peter Dungba Vo
*Assistant Examiner* — Jeffrey T Carley
(74) *Attorney, Agent, or Firm* — Yee & Associates, P.C.

(57) ABSTRACT

The present invention provides systems and methods for embedding a filament or filament mesh in a three-dimensional structure, structural component, or structural electronic, electromagnetic or electromechanical component/device by providing at least a first layer of a substrate material, and embedding at least a portion of a filament or filament mesh within the first layer of the substrate material such the portion of the filament or filament mesh is substantially flush with a top surface of the first layer and a substrate material in a flowable state is displaced by the portion of the filament and does not substantially protrude above the top surface of the first layer, allowing the continuation of an additive manufacturing process above the embedded filament or filament mesh. A method is provided for creating interlayer mechanical or electrical attachments or connections using filaments within a three-dimensional
(Continued)

structure, structural component, or structural electronic, electromagnetic or electromechanical component/device.

14 Claims, 23 Drawing Sheets

(51) Int. Cl.
| | |
|---|---|
| *B33Y 10/00* | (2015.01) |
| *B33Y 30/00* | (2015.01) |
| *H05K 3/10* | (2006.01) |
| *B29C 70/68* | (2006.01) |
| *H05K 1/02* | (2006.01) |
| *B29C 64/00* | (2017.01) |

(52) U.S. Cl.
CPC .............. *H05K 3/103* (2013.01); *B29C 64/00* (2017.08); *B29C 70/681* (2013.01); *H05K 1/0284* (2013.01); *H05K 2201/0129* (2013.01); *H05K 2203/0285* (2013.01); *Y10T 29/49171* (2015.01); *Y10T 29/49172* (2015.01)

(58) Field of Classification Search
CPC ....... A63F 9/0468; B33Y 10/00; B33Y 30/00; Y10T 29/49171; Y10T 29/49172; Y10T 29/5317; Y10T 29/53235
See application file for complete search history.

(56) References Cited

U.S. PATENT DOCUMENTS

| | | | |
|---|---|---|---|
| 4,641,840 A | 2/1987 | Larson | |
| 4,717,438 A * | 1/1988 | Benge | B32B 38/0004 156/152 |
| 4,863,789 A | 9/1989 | Arai | |
| 5,096,532 A | 3/1992 | Neuwirth et al. | |
| 5,121,329 A * | 6/1992 | Crump | B22F 3/115 228/180.5 |
| 5,412,865 A * | 5/1995 | Takaoka | H01G 4/308 156/235 |
| 5,656,905 A | 8/1997 | Tsai | |
| 5,694,680 A | 12/1997 | Yamada et al. | |
| 5,950,303 A * | 9/1999 | McConnelee | B29C 63/0026 269/37 |
| 6,153,034 A * | 11/2000 | Lipsker | B29C 41/36 156/167 |
| 6,451,154 B1 * | 9/2002 | Grabau | G06K 17/0025 156/300 |
| 6,457,626 B1 | 10/2002 | Sheehan et al. | |
| 6,501,043 B1 * | 12/2002 | Ruben | B23K 26/22 219/121.63 |
| 6,626,364 B2 | 9/2003 | Taban | |
| 6,698,089 B2 | 3/2004 | Finn et al. | |
| 6,699,265 B1 * | 3/2004 | O'Phelan | A61N 1/375 361/509 |
| 7,017,905 B2 | 3/2006 | Lindsey | |
| 7,334,791 B2 | 2/2008 | Lindsey et al. | |
| 7,419,630 B2 * | 9/2008 | Palmer | B29C 67/0059 264/255 |
| 7,555,357 B2 | 6/2009 | Holzwarth | |
| 7,556,490 B2 * | 7/2009 | Wicker | B29C 67/0066 264/113 |
| 7,658,603 B2 * | 2/2010 | Medina | B33Y 70/00 425/375 |
| 7,959,847 B2 * | 6/2011 | Wicker | B29C 67/0066 264/255 |
| 7,981,572 B2 * | 7/2011 | Fujiki | H01M 8/0271 429/400 |
| 8,123,224 B2 | 2/2012 | Deruyter | |
| 8,252,223 B2 * | 8/2012 | Medina | B29C 67/0059 264/308 |
| 2002/0019683 A1 * | 2/2002 | White | G05B 19/00 700/255 |
| 2002/0179234 A1 * | 12/2002 | Platz | H05K 3/103 156/272.8 |
| 2004/0151978 A1 * | 8/2004 | Huang | B82Y 25/00 429/83 |
| 2005/0007718 A1 * | 1/2005 | Stevenson | A61N 1/3754 361/118 |
| 2005/0164778 A1 | 7/2005 | Cooney | |
| 2007/0187137 A1 | 8/2007 | Isebo | |
| 2008/0224293 A1 | 9/2008 | Hin | |
| 2008/0268942 A1 | 10/2008 | Deruyter | |
| 2008/0314626 A1 * | 12/2008 | Moore | G06F 3/0412 174/255 |
| 2009/0020919 A1 | 1/2009 | Marsac | |
| 2009/0210101 A1 | 8/2009 | Hawkins et al. | |
| 2010/0055895 A1 | 3/2010 | Zafiropoulo et al. | |
| 2010/0058580 A1 | 3/2010 | Yasdani | |
| 2010/0240166 A1 * | 9/2010 | Ishii | H01L 31/188 438/61 |
| 2010/0291304 A1 * | 11/2010 | Becker | H05K 3/00 427/355 |
| 2011/0121476 A1 * | 5/2011 | Batchelder | B29C 67/0055 264/40.1 |
| 2013/0170171 A1 * | 7/2013 | Wicker | H01L 21/4846 361/809 |
| 2013/0180450 A1 | 7/2013 | Hamilton et al. | |

FOREIGN PATENT DOCUMENTS

| | | | |
|---|---|---|---|
| JP | 2002532912 A | 10/2002 | |
| JP | 2010219364 A | 9/2010 | |
| KR | 2011088644 A | 8/2011 | |
| KR | 20110134701 A | 12/2011 | |
| WO | 2009093248 A1 | 7/2009 | |
| WO | 2013103600 A4 | 7/2013 | |

OTHER PUBLICATIONS

International Search Report and Written Opinion for PCT/US2012/072100 from the ISA/KR dated Apr. 26, 2013.
ASTM Standard F2792-12a, "Standard Terminology for Additive Manufacturing Technologies," (2012), ASTM International, West Conshohocken, PA.
Espalin, et al. "Fused deposition modeling of polymethylmethacrylate for use in patient-specific reconstructive surgery" Rapid Prototyping Journal, vol. 16, Issue 3, 2010.
Miettinen, et al. "Inkjet printed System-in-Package design and manufacturing" Microelectronics Journal, vol. 39, Issue 12, Dec. 2008, pp. 1740-1750.
Roberson, et al. "Ohmic curing of printed silver conductive traces." Journal of Electronic Materials, Jun. 2012, vol. 1-14, pp. 2553-2566.
Ahn, et al. "Anisotropic material properties of fused deposition modeling ABS" Rapid Prototyping Journal (2002) 8 (4) pp. 248-257.
Lopes, Amit J. "Hybrid Manufacturing: Integrating Stereolithography and Direct Print Technologies," Ph.D. Dissertation, The University of Texas at El Paso, 2010, 128 pages.
Lopes, et al. "Expanding Rapid Prototyping for Electronic Systems Integration of Arbitrary Form" 17th Annual Solid Freeform Fabrication Symposium, University of Texas at Austin, Aug. 14-16, 2006.
Lopes, et al. "Integrating stereolithography and direct print technologies for 3D structural electronics fabrication" Rapid Prototyping Journal, vol. 18, Issue 2, 2012, pp. 129-143.
Olivas, et al. "Structural Electronics Through Additive Manufacturing and Micro-Dispensing" IMAPS National Conference, Oct. 2010.
Roberson, et al. "Microstructural and Process Characterization of Conductive Traces Printed from Ag Particulate Inks," Materials, vol. 4, Issue 6, 2011, pp. 963-979.
Zein, et al. "Fused Deposition Modeling of Novel Scaffold Architectures for Tissue Engineering Applications" Biomaterials, vol. 23, Issue 4, 2002, pp. 1169-1185.
International Search Report and Written Opinion of KIPO for PCT/US2014/028206, dated Jun. 27, 2014, 10 pages.

(56) References Cited

OTHER PUBLICATIONS

International Search Report and Written Opinion of KIPO for PCT/US2014/028106, dated Jun. 27, 2014, 12 pages.

* cited by examiner

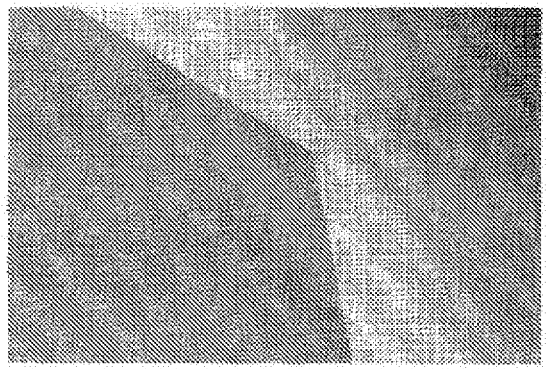
82  FIG. 22A
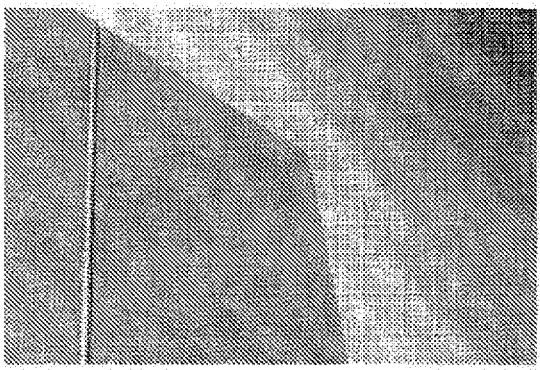
84  FIG. 22B
86  FIG. 22C
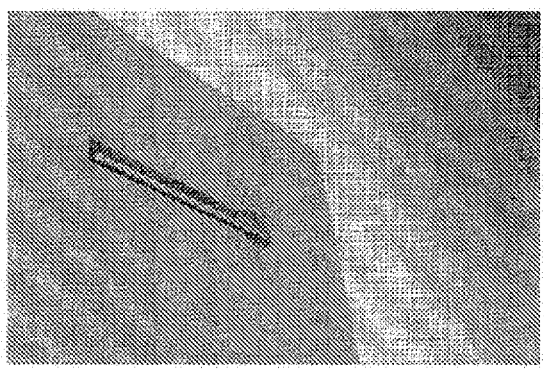
88  FIG. 22D
90  FIG. 22E
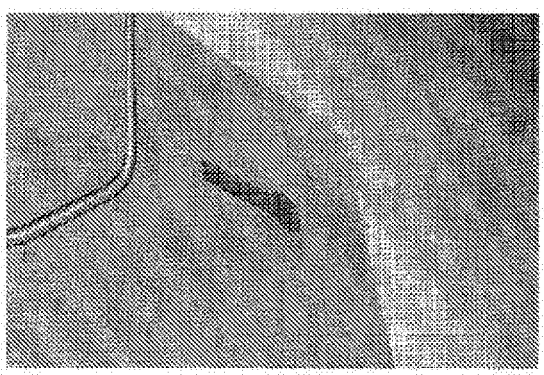
92  FIG. 22F

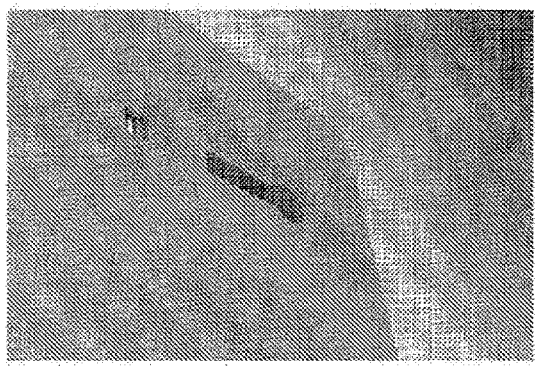
94 ↗  FIG. 22G
96 ↗  FIG. 22H
98 ↗  FIG. 22I
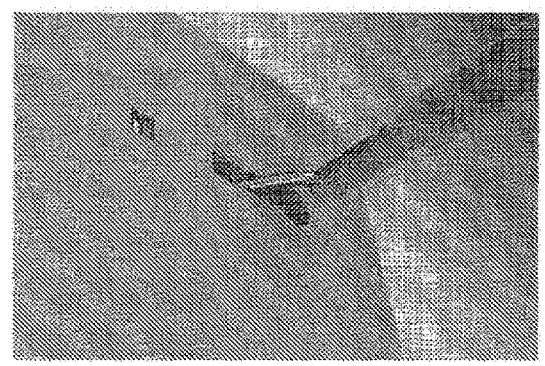
100 ↗  FIG. 22J
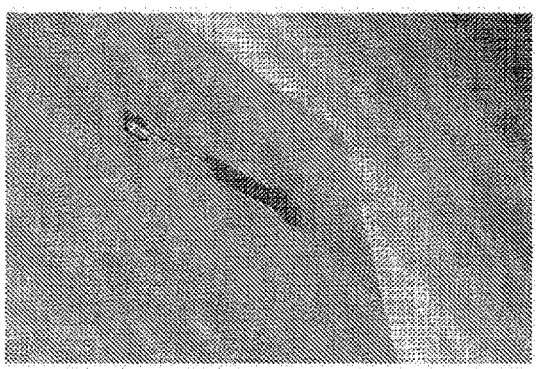
102 ↗  FIG. 22K

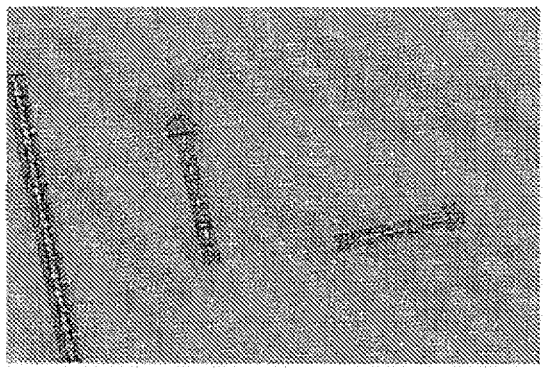
106 ↗  FIG. 23A
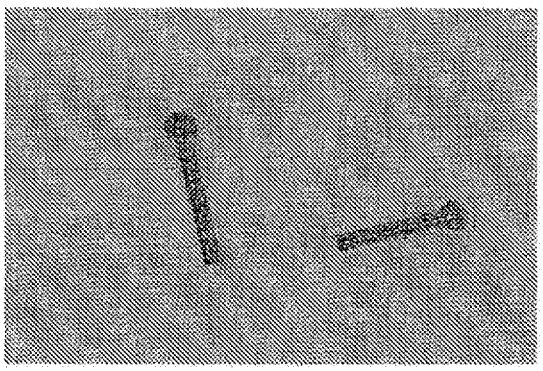
108 ↗  FIG. 23B
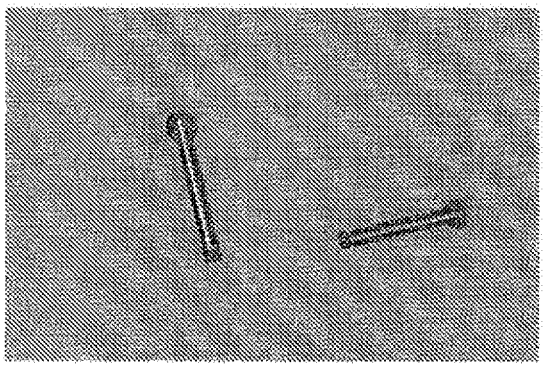
110 ↗  FIG. 23C
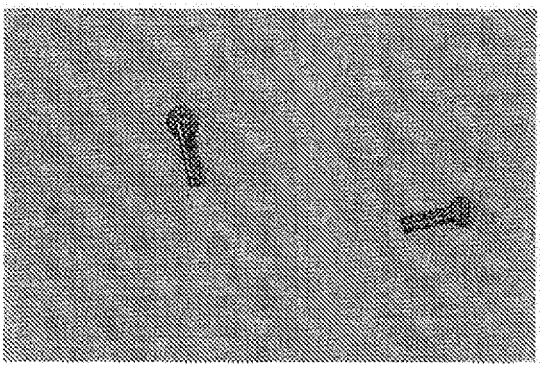
112 ↗  FIG. 23D
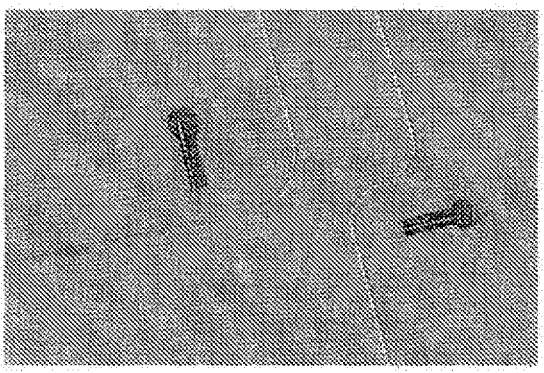
114 ↗  FIG. 23E
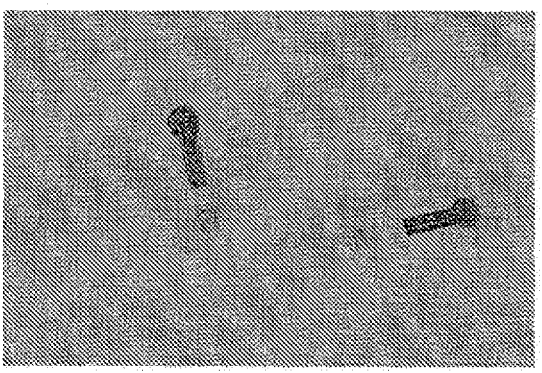
116 ↗  FIG. 23F

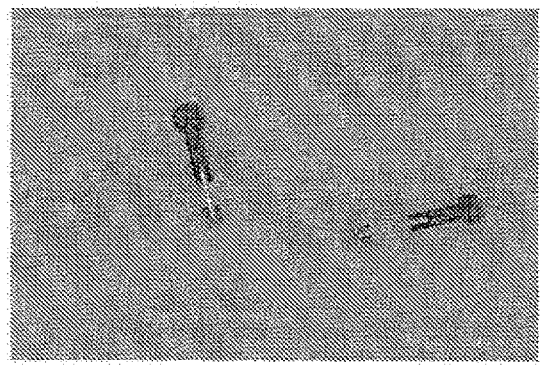
118 FIG. 23G
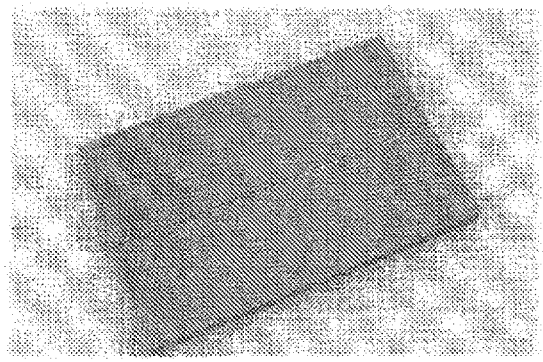
120 FIG. 24A
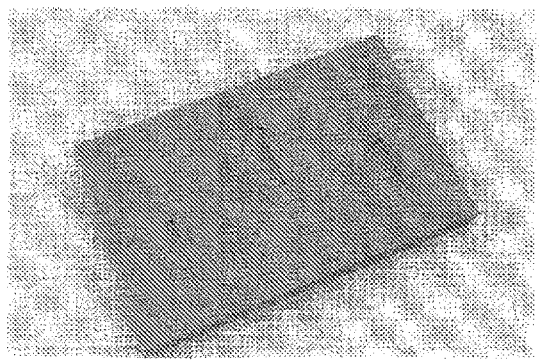
124 FIG. 24B
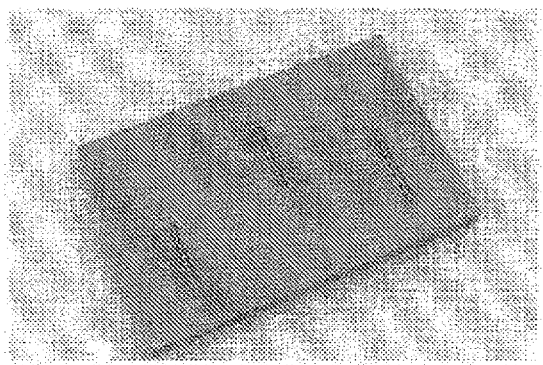
126 FIG. 24C
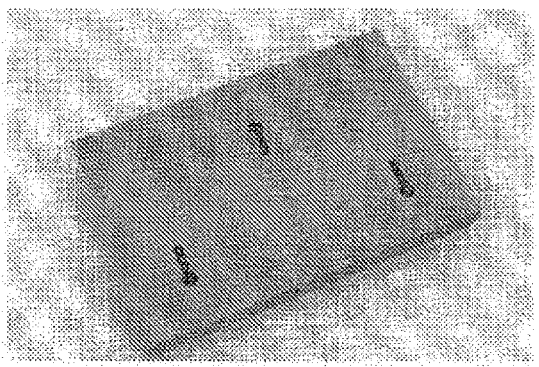
128 FIG. 24D

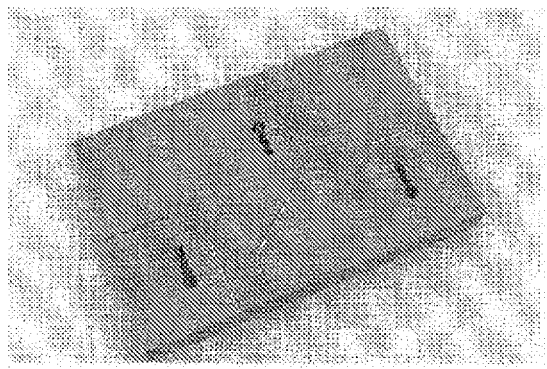
130　FIG. 24E
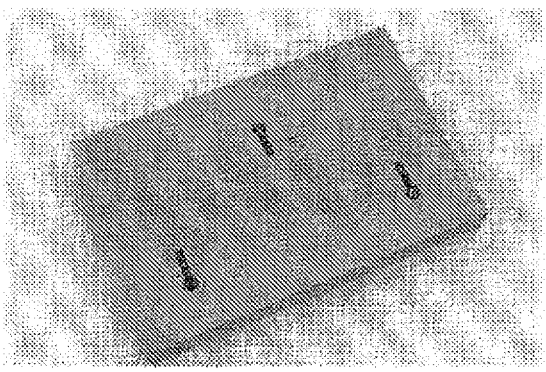
132　FIG. 24F
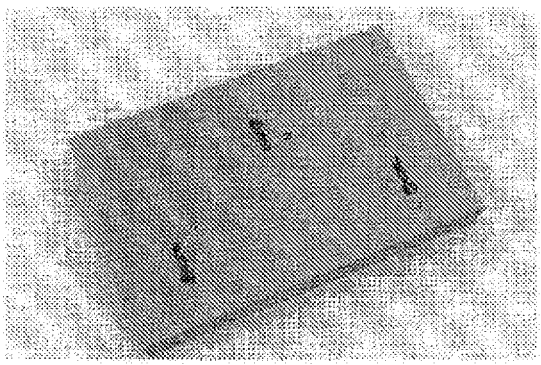
134　FIG. 24G
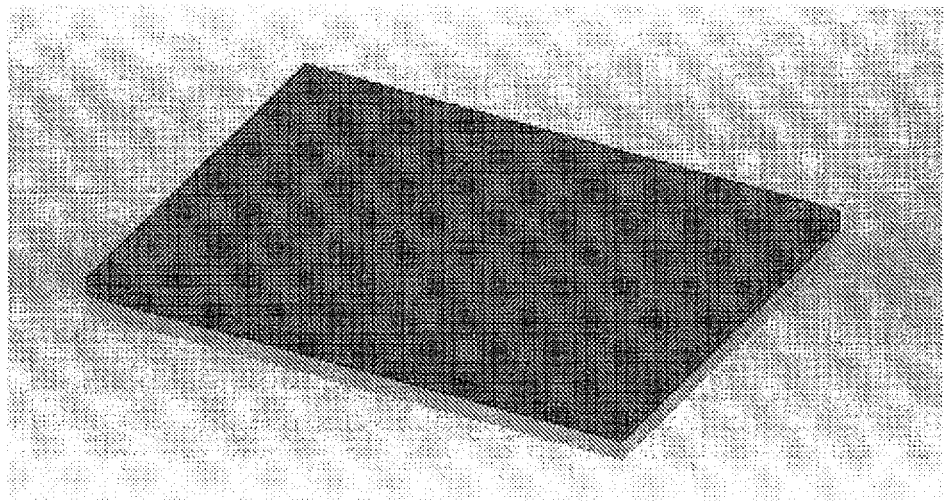
136　FIG. 25A

138

140

142

144

146

148

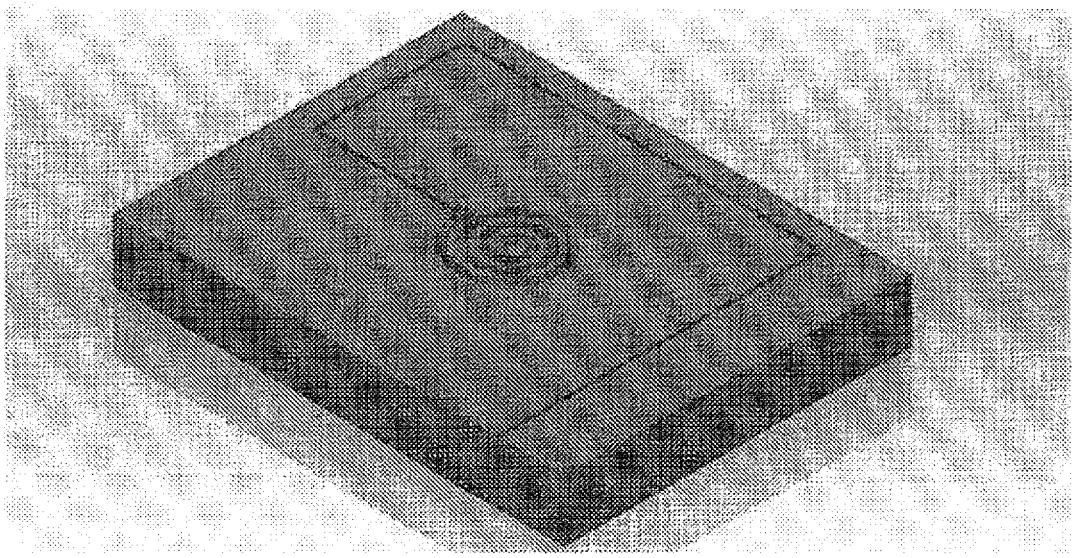
150 ↗  FIG. 25H
152 ↗  FIG. 26A

154

156

METHODS AND SYSTEMS FOR EMBEDDING FILAMENTS IN 3D STRUCTURES, STRUCTURAL COMPONENTS, AND STRUCTURAL ELECTRONIC, ELECTROMAGNETIC AND ELECTROMECHANICAL COMPONENTS/DEVICES

CROSS-REFERENCE TO RELATED APPLICATIONS

This application is related to: (1) U.S. patent application Ser. No. 13/343,651 filed on Jan. 4, 2012 entitled "Extrusion-Based Additive Manufacturing System for 3D Structural Electronic, Electromagnetic and Electromechanical Components/Devices; and (2) U.S. patent application Ser. No. 13/829,921 filed on Mar. 14, 2013, now U.S. Pat. No. 9,414,501, entitled "Method for Connecting Inter-layer Conductors and Components in 3D Structures." These applications are hereby incorporated by reference in their entirety.

TECHNICAL FIELD

Example embodiments relate to the manufacture of 3D structures and 3D structural electronic, electromagnetic and electromechanical components and devices, and more particularly to embedding filaments in three-dimensional structures, structural components, and three dimensional structural electronic, electromagnetic and electromechanical components/devices.

STATEMENT OF FEDERALLY FUNDED RESEARCH

None.

REFERENCE TO A SEQUENCE LISTING

None.

BACKGROUND

Without limiting the scope of the invention, its background is described in connection with methods for manufacturing 3D objects, structures, and 3D structural electronic, electromagnetic and electromechanical components and devices.

The application of additive manufacturing to 3D electronics is still in its infancy. Large-scale adoption has been limited due to the low reliability, low performance and high cost of current low temperature cured, conductive ink-based technology. [16] As a result, traditional printed circuit board (PCB) technology continues to dominate the electronics industry. Advancement of 3D electronics is primarily limited to a small number of researchers across the world, most of whom are pursuing conductive ink technologies. An exception to this is the Molded Interconnect Device (MID) which involves an injection molded part that is exposed to a selective laser etching process, known as laser direct structuring (LDS) and subsequent electroless plating. These devices exhibit some 3D freedom and have seen widespread use in the automotive and personal communications markets; however, they are limited in application in comparison to the current invention since the conductive traces that result from the plating process are restricted to the exterior surfaces of the molded part that are accessible to the etching laser, and therefore cannot exhibit the embedded, multi-layer capability of the current invention. Moreover, these electroless plating processes provide limited cross-sectional area of the fabricated conductor and consequently limit high current capability.

Efforts thus far to create 3D structural electronics using additive manufacturing (AM) processes (with the processes as described and defined in ASTM 2792-12a) have centered on the use of conductive inks dispensed in direct-print (DP) (also known as direct-write (DW)) or other processes to provide electrical interconnects between components. U.S. Pat. Nos. 7,658,603 and 8,252,223 dated February 2010 and August 2012, respectively, describe in detail the integration of fluid dispensing technology with stereolithography and other AM processes to create 3D circuitry. These low temperature cured inks have weaknesses in both conductivity and in durability [17], which limit the application of AM fabricated 3D structural electronics to simple devices that are not subject to mechanical shock, vibration, large current or power densities, temperature extremes or applications with high reliability requirements.

U.S. Pat. No. 6,626,364 issued September 2003 describes a method of rapidly embedding antenna wire into thin thermoplastic smart cards using an ultrasonic horn mounted on a motion control system and employing a mechanism to supply antenna wire through the horn to the work surface. The antenna wire is ultrasonically embedded in a flat, smooth and solid plastic sheet.

There is, however, a need for methods and systems for embedding a filament (e.g., wire, mesh, etc.) in a thermoplastic device during the fabrication of a geometrically complex and intricate 3D structure with embedded electronics, sensors and actuators. There is also a need for improving the mechanical performance of AM-manufactured 3D parts as has been stated by Ahn et al. [18] where the ultimate tensile strength of test parts made from acrylonitrile butadiene styrene (ABS) and produced using fused deposition modeling (FDM), a well known material extrusion AM process, was about 10-73% of a mold injected part of the same material (UTS of 26 MPa). This gap in mechanical properties between AM-produced parts and injection molded parts extends passed tensile properties to include impact, flexural, compression, creep, and fatigue properties, which collectively limit the application of AM-produced parts to prototypes.

BRIEF SUMMARY

The present invention provides methods and systems for embedding a filament (e.g., wire, mesh, etc.) in a thermoplastic substrate during the fabrication of a 3D structure that can be geometrically complex and intricate, a structural component, or a structure with embedded electronics, sensors and actuators. In addition, the filament can be embedded in multiple layers of the thermoplastic device. The present invention provides electrical interconnects with conductivity and durability comparable to that of traditional printed circuit board (PCB) technology.

The embedding of filaments or meshes within regions of a layer or across layers using the present invention produces a composite structure that improves the mechanical strength of AM-manufactured parts. When compared to as-built FDM-produced ABS parts, an improvement of 37% for FDM-produced ABS parts with one embedded plain steel wire mesh has been observed using one embodiment of the present invention. Further improvements are expected with the use of mesh made from mechanically robust materials (i.e., stainless steel, copper chromium alloys) and multiple meshes within the same polymer part. Additionally, the embedding of thermally conductive filaments within the thermoplastic enables passive thermal management for devices that produce heat and require heat dissipation.

The present invention allows a high-reliability method of creating electrical interconnects in thermoplastics-based 3D electronics systems fabricated with additive manufacturing allowing a much greater market potential for the technology. The invention will in the short term result in commercially-viable, mass-customized 3D printed electronics (e.g. smart prosthetics, wearable electronics, mission specific UAVs or satellites, etc.)—revolutionizing the manufacturing and distribution of electronics.

More specifically, the present invention provides methods of embedding a filament or mesh in a three-dimensional electronic, electromagnetic or electromechanical component/device by providing at least a first layer of a substrate material, and embedding at least a portion of a filament within the first layer of the substrate material such that the portion of the filament is substantially flush with a top surface of the first layer and a portion of the substrate material in a flowable state (i.e., its rubber, rubbery flow, or liquid flow region of viscoelastic behavior, etc.) is displaced by the portion of the filament and does not substantially protrude above the top surface of the first layer. This method can be used to make a three-dimensional electronic, electromagnetic or electromechanical component/device. Moreover, this method can be implemented as a computer program embodied on a non-transitory computer readable medium wherein the steps are performed using one or more code segments. Note that the first layer does not have to be the bottom, initial or very first layer of substrate material used to build the three-dimensional electronic, electromagnetic or electromechanical component/device. Furthermore, a single design layer may involve multiple process layers (i.e., multiple steps of depositing thin layers of substrate material may be required to build a first or subsequent design layer of a given thickness).

In addition, the present invention provides systems for making a three-dimensional electronic, electromagnetic or electromechanical component/device that includes a three-dimensional printing device and a first machine. The three-dimensional printing device creates one or more layers of a three-dimensional substrate by depositing a substrate material in a layer-by-layer fashion. The first machine embeds at least a portion of a filament within a first layer of the substrate material such that the portion of the filament is substantially flush with a top surface of the first layer and a portion of the substrate material in a flowable state (i.e., its rubber, rubbery flow, or liquid flow region of viscoelastic behavior, etc.) is displaced by the portion of the filament and does not substantially protrude above the top surface of the first layer.

BRIEF DESCRIPTION OF THE DRAWINGS

For a more complete understanding of the features and advantages of the present invention, reference is now made to the detailed description of the invention along with the accompanying figures and in which:

FIGS. 22A-22K are images showing a progression of creating an inter-layer connection in accordance with another embodiment of the present invention;

FIGS. 23A-23G are images showing another progression of creating an inter-layer connection using a wire mesh plane (as with multiple power or ground connections) in accordance with another embodiment of the present invention;

FIGS. 24A-24G are images showing another progression of creating an inter-layer connection in accordance with another embodiment of the present invention;

FIGS. 25A-25H are images showing another progression of creating an inter-layer connection in accordance with another embodiment of the present invention; and FIGS. 26A-26D are images showing another progression of creating an inter-layer connection in accordance with another embodiment of the present invention.

DETAILED DESCRIPTION

Figure 1:
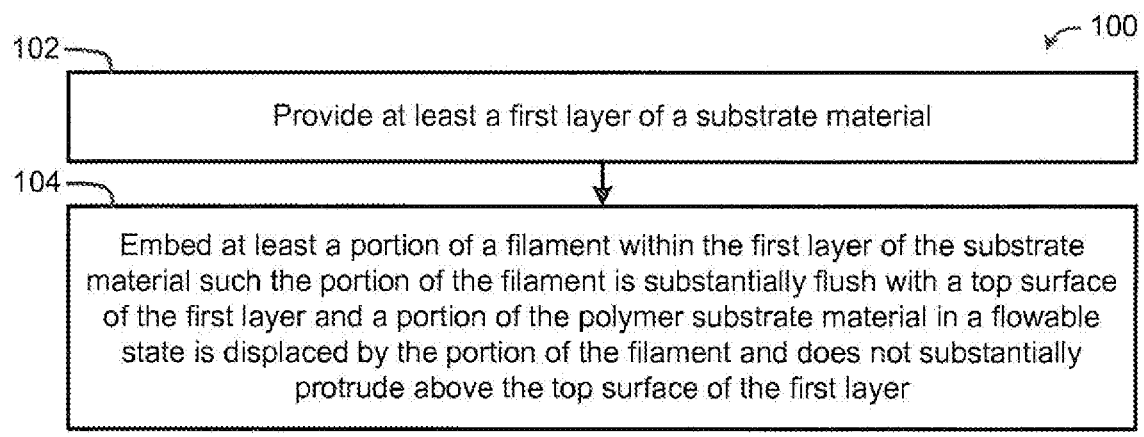
FIG. 1 is a flow chart of a method for embedding a filament in a three-dimensional electronic, electromagnetic or electromechanical component/device in accordance with one embodiment of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an," and "the" are not intended to refer to only a singular entity, but include the general class of which a specific example may be used for illustration. The terminology herein is used to describe specific embodiments of the invention, but their usage does not delimit the invention, except as outlined in the claims.

The present invention involves the application of an energy source to generate heat in a filament or filament mesh and pressure sufficient to allow it to be embedded into an additively manufactured thermoplastic substrate to form 3D structural components, devices, or systems, or to form 3D structural electronic, electromagnetic, or electromechanical components, devices, or systems. The present invention also involves attachment methods for connecting the filament or filament mesh to (or between) other filaments, meshes, thermal management components, mechanical components, electronic components, or electromechanical components.

The energy source used for embedding the filament or filament mesh may be: 1) acoustical energy in the ultrasonic frequency range, as may be found in typical ultrasonic welding or ultrasonic sewing equipment, applied under pressure directly to the filament or filament mesh resulting in frictional heating between the filament or mesh and the substrate material; 2) joule heating induced in an electrically conductive filament or filament mesh by intense time varying magnetic fields as may be found with induction heating or induction melting equipment; 3) direct contact (conduction) heating as may be found with resistance soldering equipment; 4) joule heating as may occur when sufficient electrical current is passed through an electrically conductive filament; 5) forced convection heating such as that found in hot air reflow soldering systems; 6) infrared radiant heating such as may be found in infrared reflow soldering systems; 7) any other method of direct or indirect heating well known to those skilled in the art; or 8) any combination thereof. To minimize the amount of energy required to embed the mesh, the layer of substrate polymer can be made porous by modifying the spatial deposition of the polymer material via the slicing software. For example, using the software that prepares the build file for a material extrusion AM machine, the distance between material beads can be increased to increase the porosity of the substrate layer. The increased porosity would not only help reduce the amount of energy that is required to embed the mesh, but also reduce the amount of polymer material that could protrude above the surface. It should be noted, however, that even if the substrate material is solid and the substrate material is displaced an amount equal to the volume of the embedded filament, most AM technologies should be able to accommodate this displacement in subsequent layer deposition.

In an example embodiment, custom tooling and motion control hardware as well as laser micro-welding, resistance welding, ultrasonic welding, soldering, wire bonding, or any attachment process well known by those skilled in the art, are used for the deposition and attachment of solid conductive wire within an additively manufactured thermoplastic substrate. An example embodiment can utilize additive manufacturing processes such as Fused Deposition Modeling (FSM) or other material extrusion additive manufacturing processes, Selective Laser Sintering (SLS) or other powder bed fusion additive manufacturing processes, laminated object manufacturing (LOM) or other sheet lamination additive manufacturing processes utilizing thermoplastic sheets, stereolithography or other vat photopolymerization additive manufacturing processes using photocurable thermoplastics, material jetting of photocurable thermoplastics, or other additive thermoplastic-based technologies yet to be developed to create more robust parts that can be used directly in engineering design applications as well as 3D structural electronic, electromagnetic, and electromechanical components and systems. Preliminary experiments have shown the effective use of ultrasonic (acoustical) energy as well as heat energy to rapidly embed conductive wiring into thermoplastic substrate materials to form electrical interconnects. Also, the ultimate tensile strength of FDM-manufactured ABS parts has been improved by 37% when plain steel wire mesh has been embedded using one example embodiment. Finally, note that one or more of the above process steps described herein can be performed automatically or manually to achieve essentially the same results.

The wire or mesh introduced within the structure can serve as 1) electrical interconnect, 2) antenna, 3) power or ground plane, 4) electromagnetic shielding, 5) heat sink, or 6) as a reinforcement to mechanically strengthen the device being fabricated—all of which in the context of layer-by-layer additive manufacturing (AM). One example embodiment involves interrupting the AM build process to allow a filament or filament mesh to be embedded and attached to other filaments, meshes, or components where desired, and then continuing the AM process. It should be noted, however, that the embodiments are not limited to the embedding of filaments and mesh within the interior of an additively manufactured thermoplastic substrate, but extends to the embedding of the same on the exterior surfaces of an additively manufactured thermoplastic substrate. In order to allow subsequent layers to be built above the embedded wiring or mesh, the surface and wire together must be maintained in a dimensionally compliant state (i.e., flush), meaning that the wire must be sufficiently embedded and a portion of the substrate material in its flowable state (i.e., its rubber, rubbery flow, or liquid flow region of viscoelastic behavior, etc.) must be controlled so as not to protrude above the surface to an extent that inhibits the continued layer-by-layer build process. Alternatively, the wire does not have to be sufficiently embedded to prevent all protrusions (wire and/or substrate material) if the process is capable of detecting and accommodating the protrusions by modifying the layers deposited above the protrusions. The textured surface that results from some AM processes such as, but not limited to, Fused Deposition Modeling (FDM) or other material extrusion additive manufacturing processes and Selective Laser Sintering (SLS) or other powder bed fusion additive manufacturing processes, is beneficial to maintaining this compliance in that a portion of the substrate material in a flowable state (i.e., its rubber, rubbery flow, or liquid flow region of viscoelastic behavior, etc.) is displaced during the wire embedding process and allowed to flow laterally (in the X-Y plane) rather than protrude above the work surface. Moreover, the 3D fabrication freedom of AM allows for geometrical allowances (i.e., trenches, channels, cavities, etc.) with cross sections that have circular, square or triangular, or other shapes, to the extent that these shapes can be reasonably approximated with a layered AM process, to reduce the volume of displaced material (e.g., helping to maintain planarization) as well as increase the surface area of ultrasonic welding to further improve the bond. Note that multiple process layers may have to be deposited to form the geometrical allowances of a single design layer. Finally, and with appropriate motion controls, an example embodiment allows wire or mesh to be embedded on irregular and curved surfaces as might be required in structures, structural components or in 3D structural electronics applications.

Now referring, to FIG. 1, a flow chart of a method 100 for embedding a filament in a three-dimensional electronic, electromagnetic or electromechanical component/device in accordance with one embodiment of the present invention is shown. A first layer of a substrate material is provided in block 102. The one or more layers can be deposited using Fused Deposition Modeling (FDM) or other material extrusion additive manufacturing processes, Selective Laser Sintering (SLS) or other powder bed fusion additive manufacturing processes, laminated object manufacturing (LOM) or other sheet lamination additive manufacturing processes using thermoplastic sheets, stereolithography or other vat photopolymerization additive manufacturing processes using photocurable thermoplastics, material jetting of photocurable thermoplastics, or other additive thermoplastic-based technologies yet to be developed. Note that the first layer does not have to be the bottom, initial or very first layer of substrate material used to build the three-dimensional electronic, electromagnetic or electromechanical component/device. Furthermore, a single design layer may involve multiple process layers (i.e., multiple steps of depositing thin layers of substrate material may be required to build a first or subsequent design layer of a given thickness).

Figure 2A:
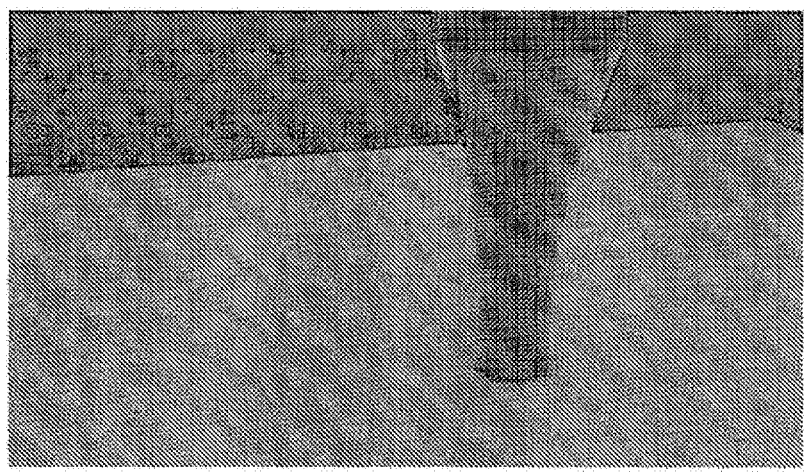
FIGS. 2A, 2B and 2C are images showing various ultrasonic horns used to embed a filament in a substrate in accordance with one embodiment of the present invention.
Figure 2B:
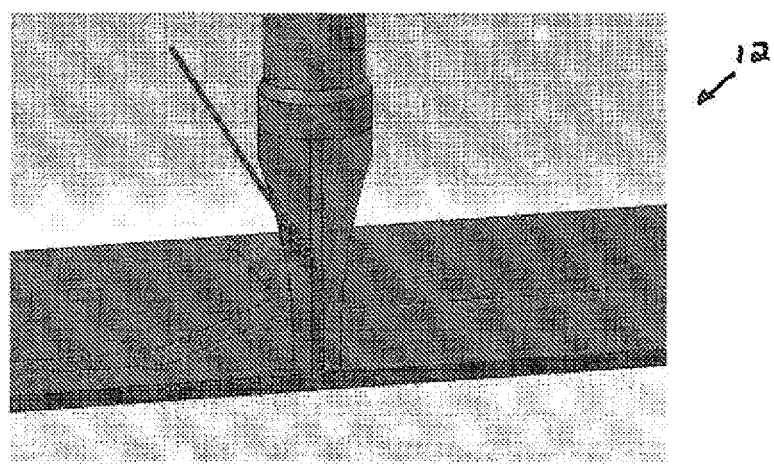
Figure 2C:
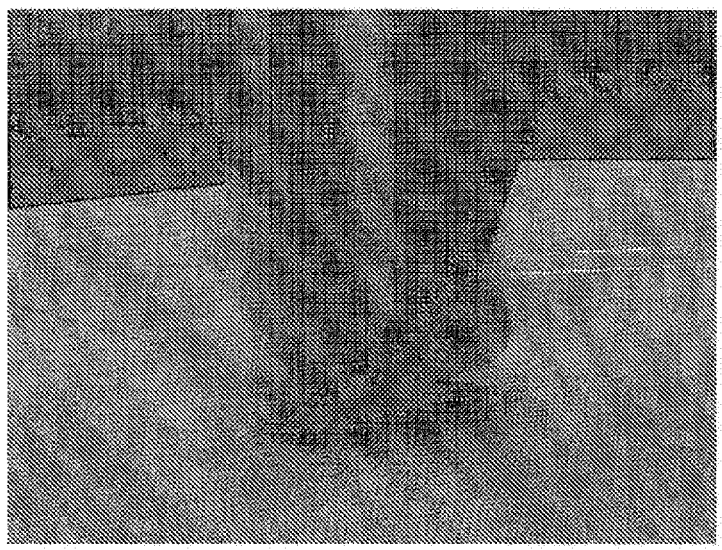
Figure 3A:
FIGS. 3A and 3B are images showing a rotary ultrasonic horn in accordance with another embodiment of the present invention.
Figure 3B:
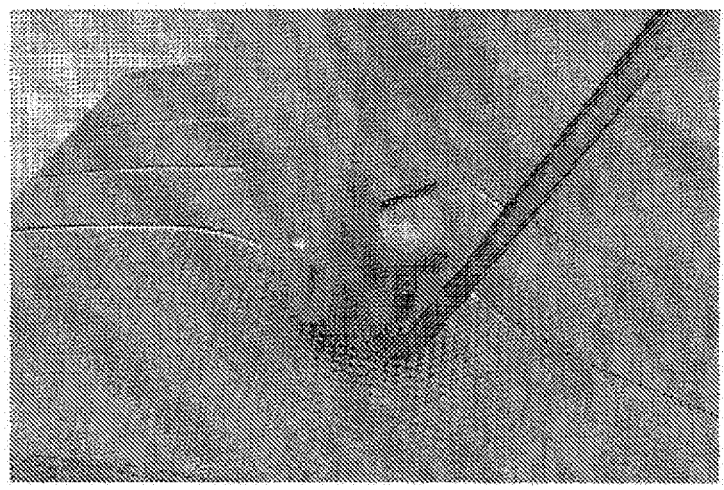
Figure 4:
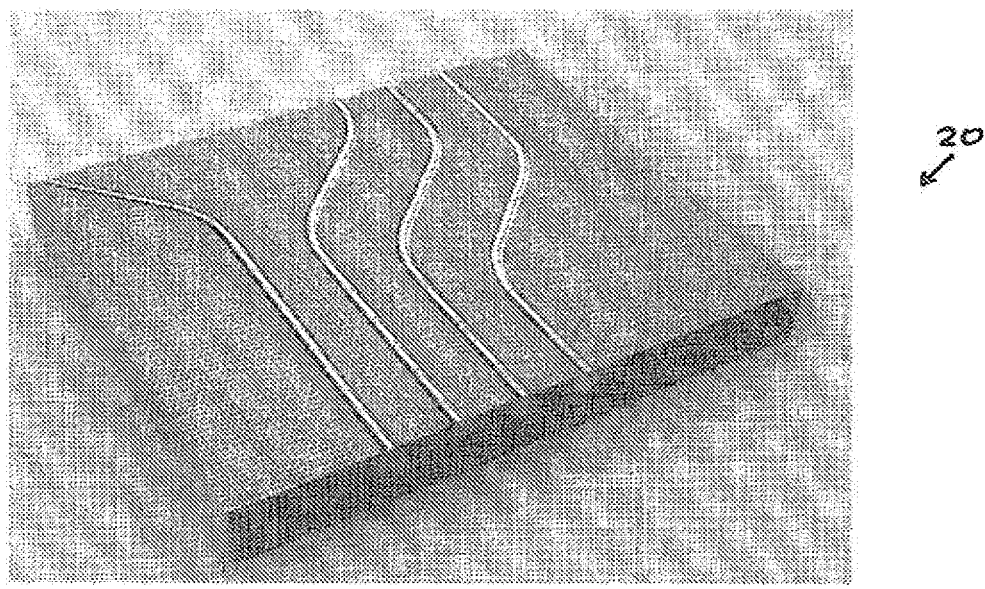
FIG. 4 is an image showing a cross section of filaments embedded within a substrate in accordance with the present invention.
Figure 5:
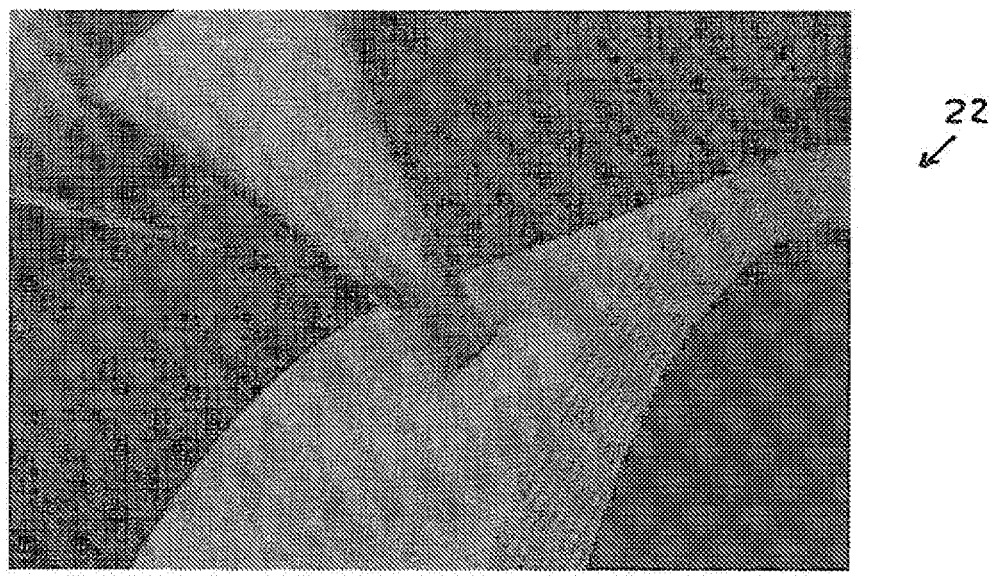
FIG. 5 is an image showing a hollow ultrasonic horn embedding a filament in a substrate having a curved surface in accordance with one embodiment of the present invention.
Figure 6A:
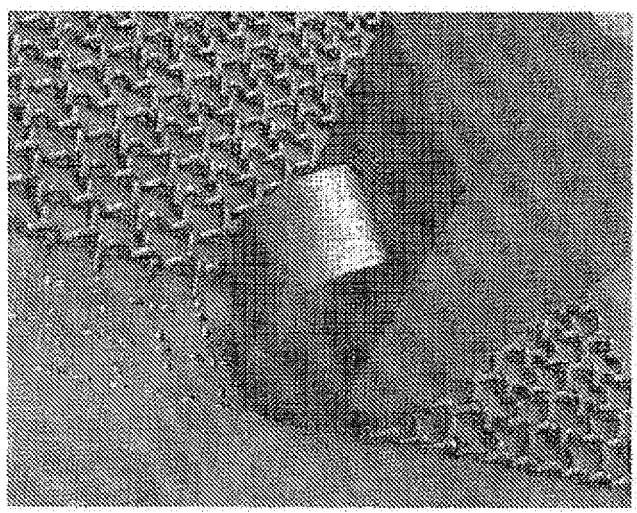
FIGS. 6A and 6B are images showing a rotary ultrasonic horn embedding a mesh within a substrate in accordance with another embodiment of the present invention.
Figure 6B:
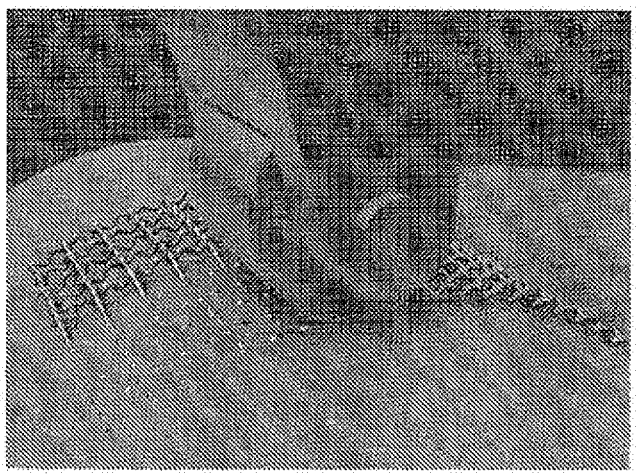
Figure 7:
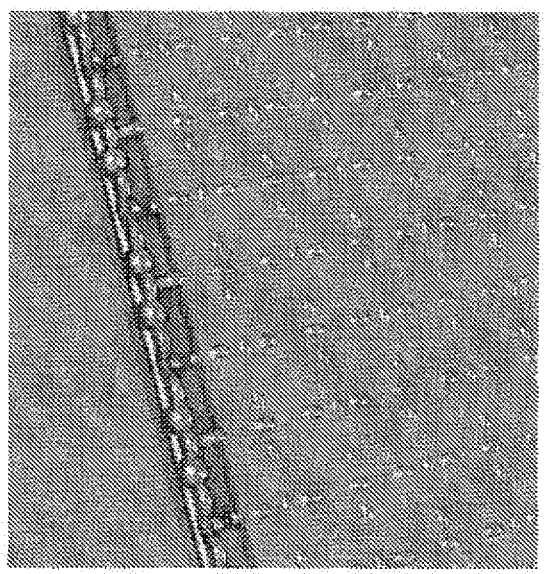
FIG. 7 is an image showing a mesh embedded within a substrate wherein a portion of the mesh is disposed within a cavity and attached by a laser welding process, a resistance welding process, an ultrasonic welding process, a soldering process, a wire bond process, or any attachment process well known by those skilled in the art to another filament or wire laid down in a previous process step in accordance with another embodiment of the present invention.
Figure 8A:
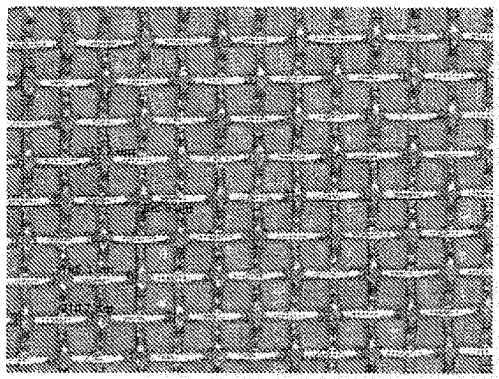
FIGS. 8A-8D are images showing a progression of embedding a mesh within a substrate in accordance with another embodiment of the present invention.
Figure 8B:
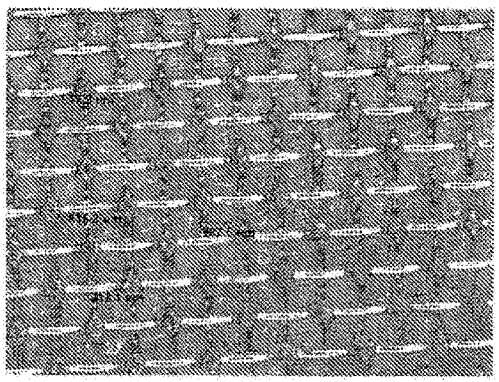
Figure 8C:
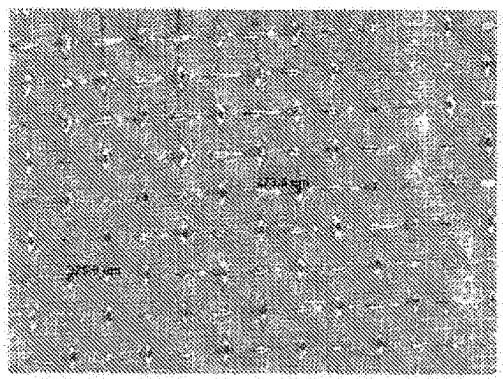
Figure 8D:
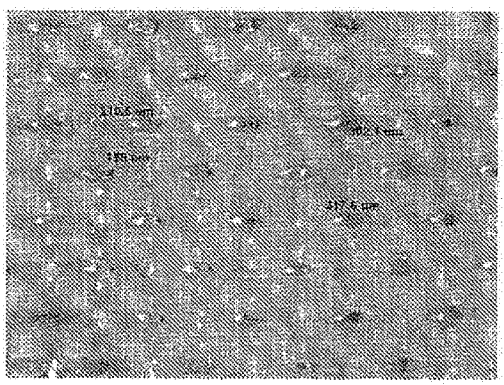
Figure 9A:
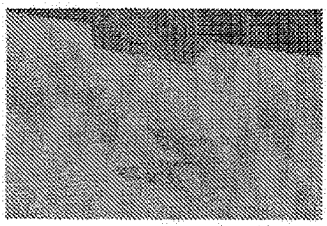
FIGS. 9A-9C are images showing a progression of embedding a mesh having a specific pattern within a substrate in accordance with another embodiment of the present invention.
Figure 9B:
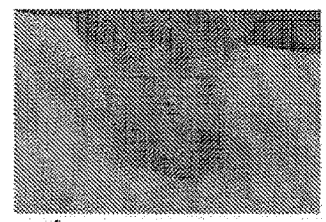
Figure 9C:
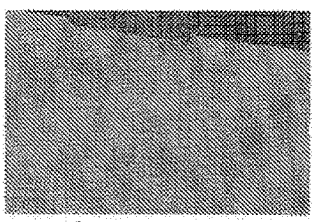
Figure 12A:
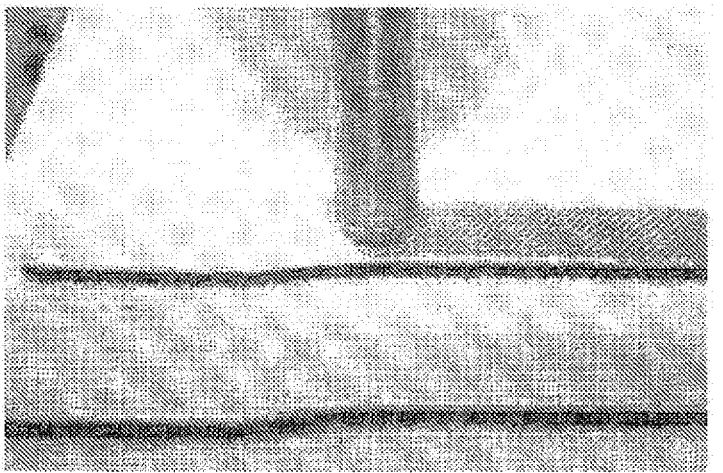
FIGS. 12A-12B are images of plain steel mesh being embedded into FDM-built ABS parts (Standard ASTM D638 type I test specimens) using an ultrasonic horn (horn on left focused to a small working surface area (~130 mm$^2$), and horn on right focused to a larger surface area (~1450 mm$^2$)) in accordance with one embodiment of the present invention.
Figure 12B:
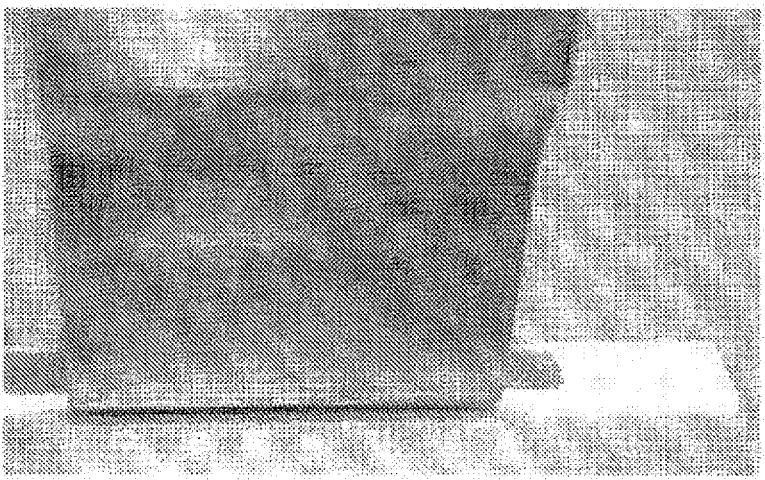
Figure 13A:
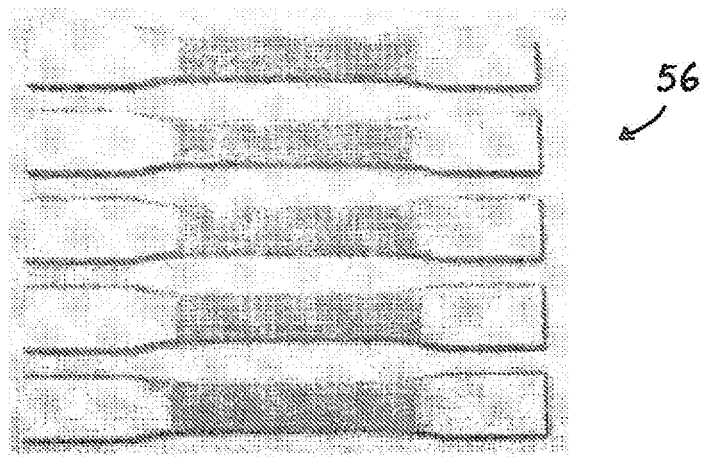
FIGS. 13A-13B are images of embedded plain steel meshes in FDM-built ABS parts (Standard ASTM D638 type I test specimens) in accordance with one embodiment of the present invention.
Figure 13B:
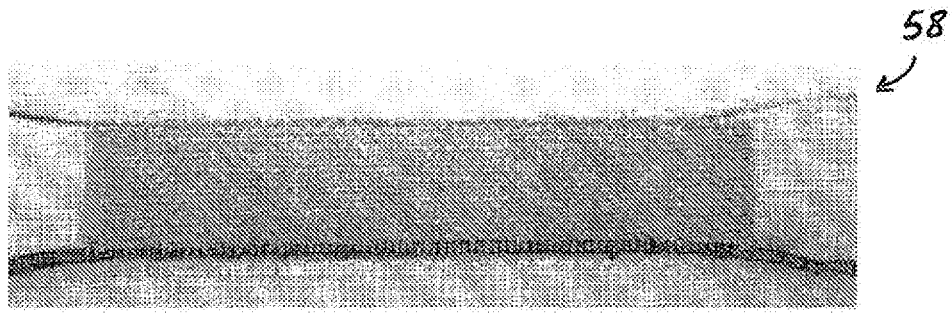
Figure 14:
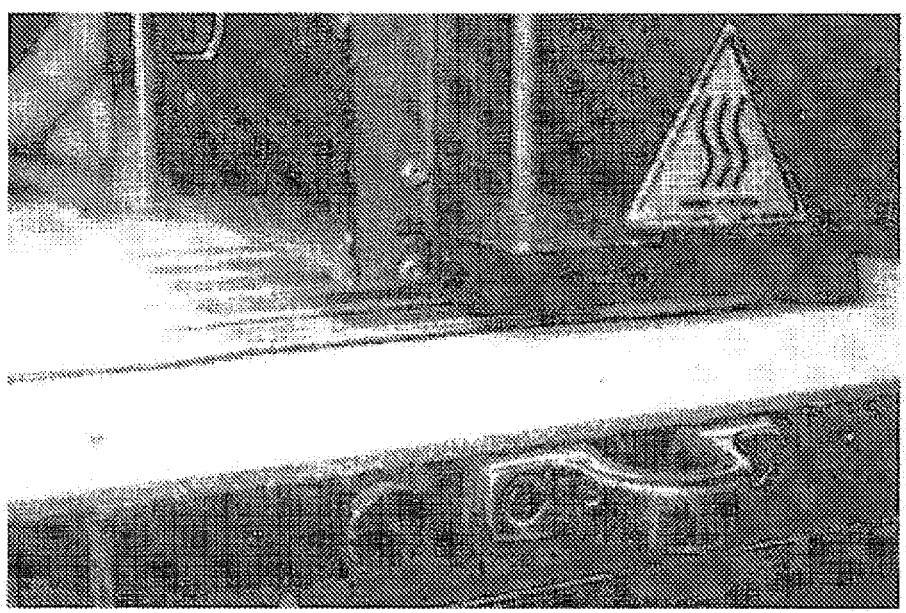
FIG. 14 is an image of ABS material being deposited over embedded plain steel mesh using FDM technology to produce a polymer-mesh composite in accordance with one embodiment of the present invention.
Figure 15A:
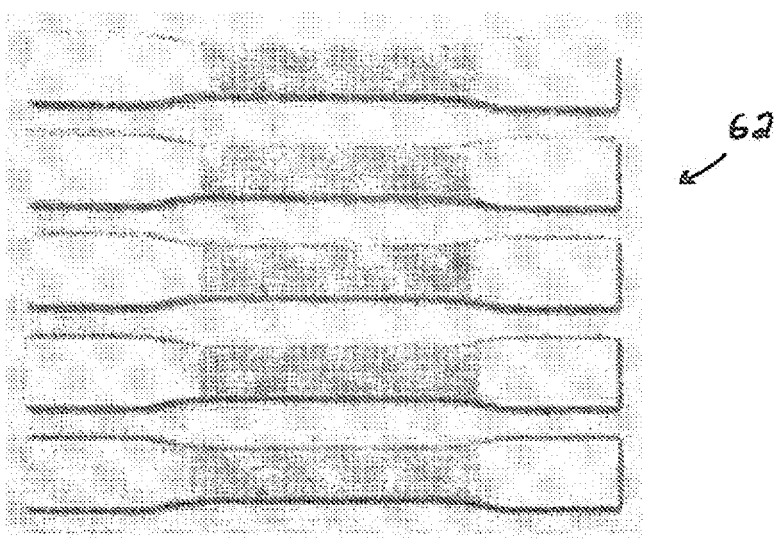
FIGS. 15A-15B are images of plain steel mesh embedded into FDM-built ABS parts (Standard ASTM D638 type I test specimens) in accordance with one embodiment of the present invention.
Figure 15B:
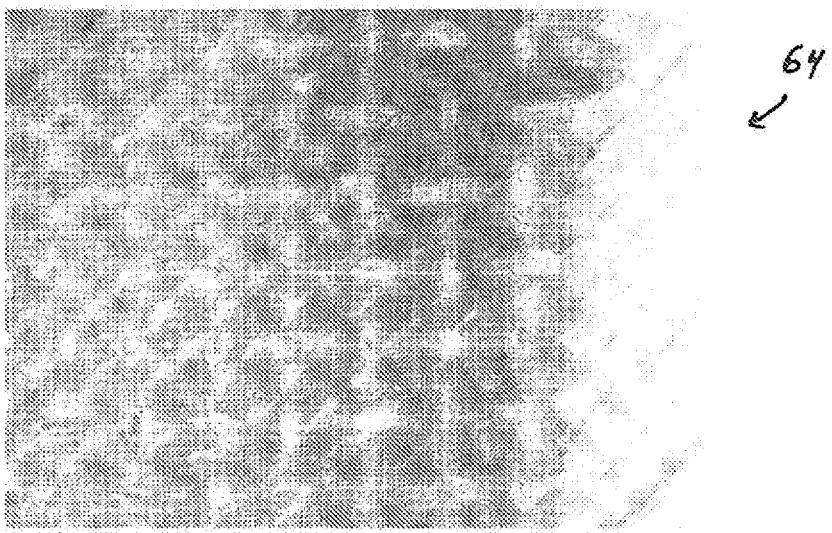
Figure 16A:
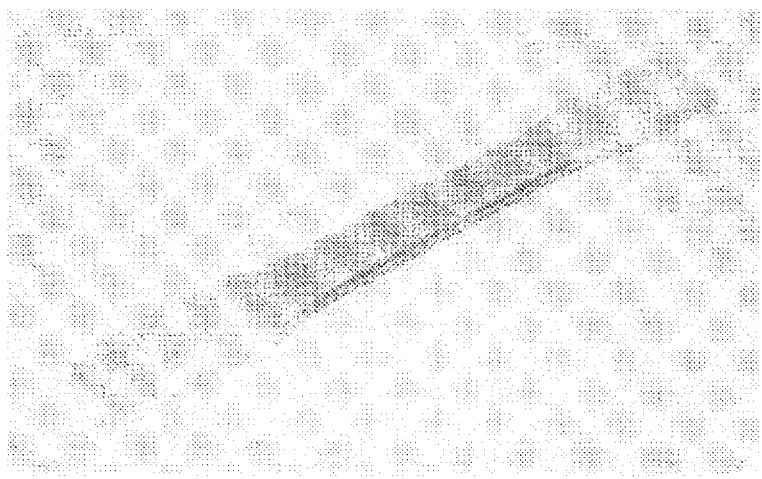
FIGS. 16A-16B are images of polymer-mesh composite structure made by embedding a plain steel mesh into an FDM-built ABS part (Standard ASTM D638 type I test specimen, isometric and side views) in accordance with one embodiment of the present invention.
Figure 16B:
Figure 17:
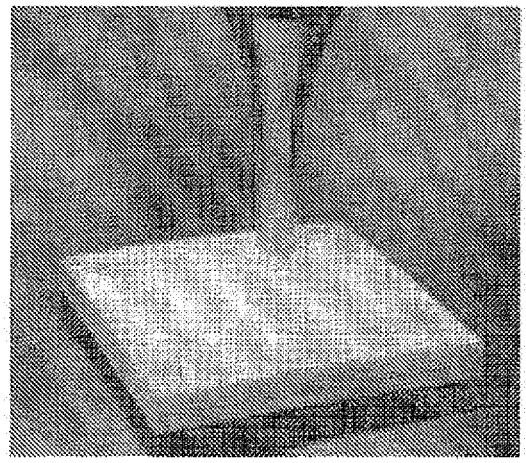
FIG. 17 is an image of ultrasonic wire embedding process in accordance with one embodiment of the present invention.
Figure 18A:
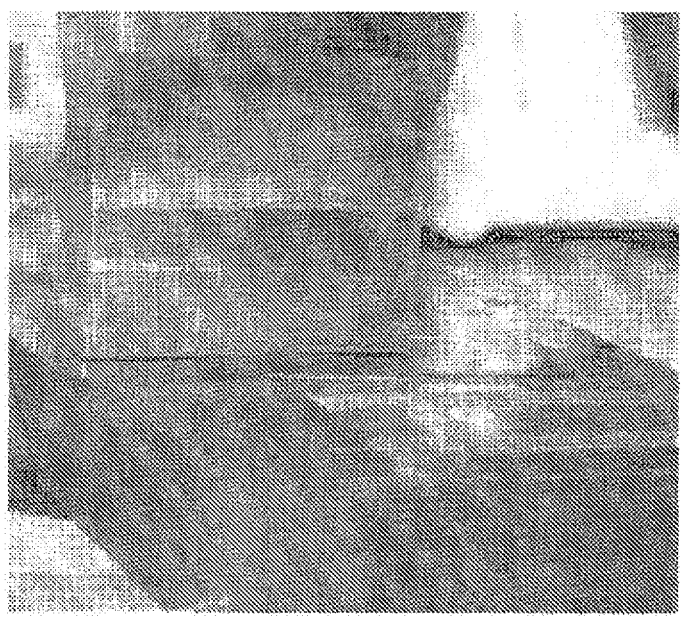
FIGS. 18A-18B are images of plain steel mesh embedded into PVC part that was built using a sheet lamination additive manufacturing process (general view on left, top view on right) in accordance with one embodiment of the present invention.
Figure 18B:
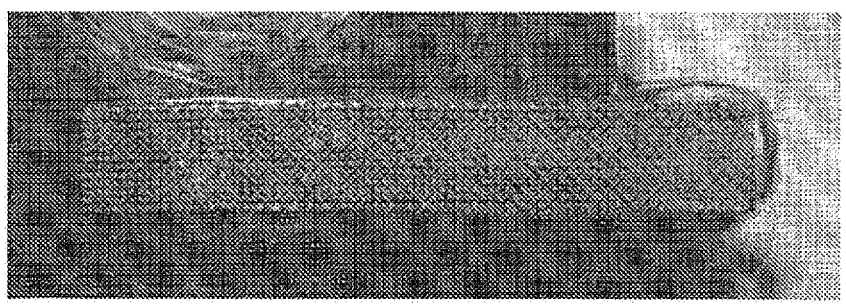
Figure 19A:
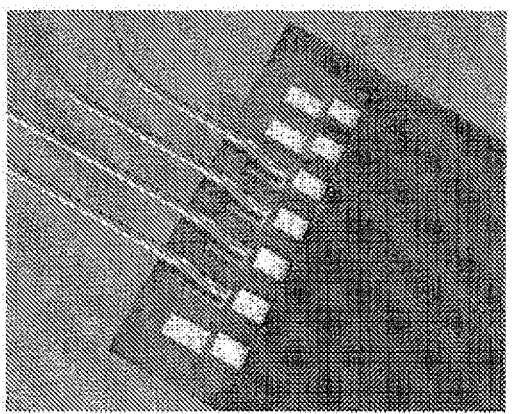
FIGS. 19A and 19B are images showing a progression of attaching the filaments to a component by a laser micro-welding process, a resistance welding process, an ultrasonic welding process, a soldering process, a wire bond process, or any attachment process well known by those skilled in the art in accordance with another embodiment of the present invention.
Figure 19B:
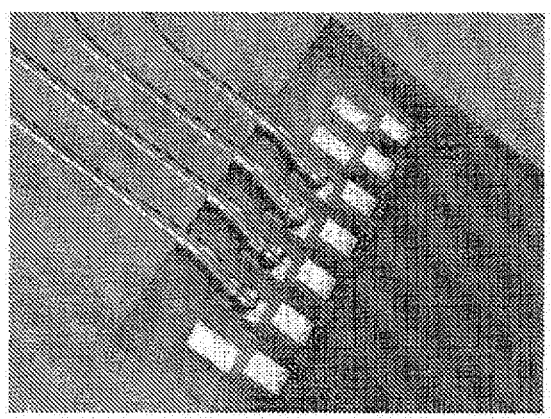
Figure 20:
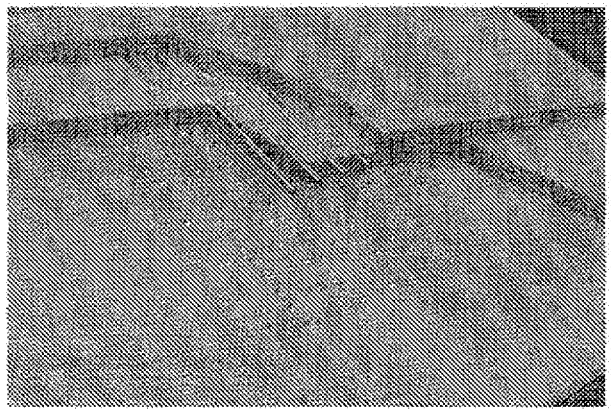
FIG. 20 is an image showing various layers of a 3D device in accordance with another embodiment of the present invention.

FIGS. 2A, 2B, and 2C illustrate respective images 10, 12, 14 showing various ultrasonic horns used to embed a filament in a substrate in accordance with one example embodiment. FIGS. 3A and 3B illustrate respective images 16, 18 showing a rotary ultrasonic horn in accordance with another example embodiment. FIG. 4 illustrates an image 20 showing a cross-section of filaments embedded within a substrate in accordance with an example embodiment. FIG. 5 illustrates an image 22 depicting a hollow ultrasonic horn embedding a filament in a substrate having a curved surface in accordance with an example embodiment. FIGS. 6A and 6B illustrate respective images 24, 26 showing a rotary ultrasonic horn embedding a mesh within a substrate in accordance with another example embodiment. FIG. 7 illustrates an image 28 showing a mesh embedded within a substrate wherein a portion of the mesh is disposed within a cavity and attached by a laser welding process, a resistance welding process, an ultrasonic welding process, a soldering process, a wire bond process, or any attachment process well known by those skilled in the art to another filament or wire laid down in a previous process step in accordance with another example embodiment. FIGS. 8A-8D illustrate respective images 30, 32, 34, 36 showing a progression of embedding a mesh within a substrate in accordance with another example embodiment. FIGS. 9A-9C illustrate respective images 38, 40, 42 showing a progression of embedding a mesh having a specific pattern within a substrate in accordance with another example embodiment. FIGS. 11A-11D illustrate respective images 44, 46, 48, 50 of conductive wire laser micro-welded to electronic components in accordance with an example embodiment. FIGS. 12A-12B illustrate respective images 52, 54 of plain steel mesh being embedded into FDM-built ABS parts (e.g., Standard ASTM D638 type I test specimens) using an ultrasonic horn (e.g., horn on left focused to a small working surface area, and a horn on the right focused to a larger surface area), in accordance with an example embodiment. FIGS. 13A-13B illustrate respective images 56, 58 of embedded plain steel meshes in FDM-built ABS parts (e.g., Standard ASTM D638 type I test specimens) in accordance with an example embodiment. FIG. 14 illustrates an image 60 of ABS material being deposited over embedded plain steel mesh using FDM technology to produce a polymer-mesh composite in accordance with an example embodiment. FIGS. 15A-15B illustrate respective images 62, 64 of plain steel mesh embedded into FDM-built ABS parts (e.g., Standard ASTM D638 type I test specimens) in accordance with an example embodiment. FIGS. 16A-16B illustrate respective images 66, 68 of polymer-mesh composite structure made by embedding a plain steel mesh into an FDM-built ABS part (e.g., Standard ASTM D638 type I test specimen, isometric, and side views) in accordance with an example embodiment. FIG. 17 illustrates an image 70 of ultrasonic wire embedding process in accordance with an example embodiment. FIGS. 18A-18B illustrate respective images 72, 74 of plain steel mesh embedded into PVC part that was built using a sheet lamination additive manufacturing process (general view on left, top view on right) in accordance with an example embodiment. FIGS. 19A-19B illustrate respective images 76, 78 showing a progression of attaching the filaments to a component by a laser micro-welding process, a resistance welding process, an ultrasonic welding process, a soldering process, a wire bond process, or any attachment process well known by those skilled in the art in accordance with another example embodiment. FIG. 20 illustrates an image 80 showing various layers of a 3D device in accordance with another example embodiment.

FIGS. 22A-22K illustrate respective images 82, 84, 86, 88, 90, 92, 94, 96, 98, 100, 102 showing a progression of creating an inter-layer connection in accordance with another example embodiment. FIGS. 23A-23G illustrate respective images 106, 108, 110, 112, 114, 116, 118 showing another progression of creating an inter-layer connection using a wire mesh plane (as with multiple power or ground connections) in accordance with another example embodiment. FIGS. 24A-24G illustrate respective images 120, 122, 124, 126, 128, 130, 132, 134 showing another progression of creating an inter-layer connection in accordance with another example embodiment. FIGS. 25A-25H illustrate respective images 136, 138, 140, 142, 144, 146, 148, 150 showing another progression of creating an inter-layer connection in accordance with another example embodiment. FIGS. 26A-26D illustrate images 152, 154, 156, 148 showing another progression of creating an inter-layer connection in accordance with another example embodiment.

In a preferred embodiment of the present invention, at least a portion of a filament is ultrasonically embedded within the first layer of the substrate material such that the portion of the filament is substantially flush with a top surface of the first layer and a portion of the substrate material in a flowable state (i.e., its rubber, rubbery flow, or liquid flow region of viscoelastic behavior, etc.) is displaced by the portion of the filament and does not substantially protrude above the top surface of the first layer in block 104. Note that substantially flush does not mean that the filament has to be sufficiently embedded to prevent all protrusions (wire and/or substrate material) if the process is capable of detecting and accommodating the protrusions by modifying the layers deposited above the protrusions (e.g., adjusting porosity, thickness, etc). Such modifications can be made in software via in situ monitoring, testing and/or quality control processes. The portion of the filament can be embedded within the first layer using a wire-feed and cutting system, and one of several possible energy sources including ultrasonic (acoustical), induction heating, resistive heating, Joule heating, forced convection heating, radiant infrared heating, or other heating methods well known to those skilled in the art. The filament can be a conductive material (e.g., a metal, a metal alloy, a conductive polymer, a wire, etc.), a non-conductive material (e.g., one or more carbon fibers, one or more Kevlar fibers, etc.), an optical fiber, a conductive mesh (e.g., a set of filaments made of a metal, a metal alloy, a conductive polymer, a wire, etc.) or a non-conductive mesh (e.g., a set of carbon fibers, Kevlar fibers, etc.). For example, the mesh can be a stainless steel mesh, an aluminum mesh, a copper mesh, a brass mesh, a steel mesh, a copper chromium mesh, or a copper-nickel alloy mesh. To reduce or eliminate thermal damage or charring of the substrate polymer, a separate polymer sheet exhibiting a higher melting temperature or glass transition temperature when compared to that of the substrate polymer can be placed between the ultrasonic horn and the mesh. Moreover, the mesh can be precut into a geometrical shape. As a result, the mesh can be embedded to form a heat sink, an antenna, a conductive plane, an electromagnetic shield or a polymer-mesh composite material forming a mechanical reinforcement using a multi-step process (see FIGS. 6A-6B) or a single process step (see FIGS. 9A-9C). The filament, including the embedded mesh, can be used to improve a physical characteristic, mechanical characteristic, thermal characteristic, or an electrical characteristic of the first layer, or the three-dimensional structure, structural component, or structural electronic, electromagnetic or electromechanical component/device.

This method can be used to make a three-dimensional structural, electronic, electromagnetic or electromechanical component/device. Moreover, this method can be implemented as a computer program embodied on a non-transitory computer readable medium wherein the steps are preformed using one or more code segments.

The substrate material can be a thermoplastic material, or a thermoplastic material which is filled with another polymer material, a ceramic material, a metallic material, a mineral material, a glass ceramic material, a semi-conductor material, a nanomaterial, a biomaterial, an organic material, an inorganic material or any combination thereof to enhance mechanical, thermal, dielectric, magnetic, or electromagnetic properties. The thermoplastic material can be acrylonitrile butadiene styrene (ABS), ABSi, ABSplus, ABS-M30, ABS-M30i, ABS-ESDI, polycarbonate (PC), PC-ABS, PC-ISO, polyphenylsulfone (PPSF/PPSU), ULTEM 9085 or any combination thereof and any current or future material commercially used in the Fused Deposition Modeling or other material extrusion thermoplastic additive manufacturing processes. The material can also be polyamide, polystyrene, polypropylene, nylon, polyaryletherketone or any combination thereof and any current or future material used in the Laser Sintering or powder bed fusion additive manufacturing processes. Another polymer material can be poly (methyl methacrylate) (PMMA), polyolefin, LL-PE, HDPE, polyvinyl acetate, polyester, polyether, polyimides, polyketone, polyether ethyl ketone (PEEK), polybutadiene, polylactic acid, polycaprolactone, polyethylene terephthalate, liquid crystalline polymer (LCP), polyvinyl chloride (PVC), polyfluoroethylene, polydifluoroethylene, polytetrafluoroethylene, ZEONEX RS420, Eccostock HIK-TPO, co-polymers and block co-polymers of the previous, or any combination thereof.

Inherent in the AM processes are voids or gaps that enable a portion of the substrate material in a flowable state (i.e., its rubber, rubbery flow, or liquid flow region of viscoelastic behavior, etc.) to flow without forcing material to protrude above the surface when small volumes of material are displaced. Moreover, at least a portion of the top surface of the first layer where the portion of the filament is embedded comprises an irregularly-shaped surface or a curved surface. One or more additional layers of the three-dimensional substrate can be created by depositing the substrate material on the second layer in a layer-by-layer process.

In the preferred embodiment, the process of ultrasonically embedding wire, wire mesh, or other filaments into a thermoplastic substrate can involve the application of ultrasonic welding technology which has been used widely in industry for plastics packaging and for the joining of textiles which contain thermoplastics. This approach has also been used for welding metal materials including electrically conductive wiring. Ultrasonic welding involves converting electrical energy in the ultrasonic frequency range (e.g., typically 20 kHz to 75 kHz) into vibrational energy by use of a converter (also referred to as a transducer) which then transfers the energy either directly to a horn (also known as a sonotrode) or first through a booster whereby the amplitude of the ultrasonic vibrations is either increased (e.g., amplified) or decreased (e.g., attenuated) depending on application requirements. Ultimately, vibrational energy is transferred from the horn or sonotrode by direct contact to the material being welded. This energy causes vibrations in the thermoplastic materials being welded or otherwise joined. The vibrations result in rapid frictional heating of the thermoplastic materials in the region to be joined. This heating causes the thermoplastic substrate material to reach and exceed the glass transition temperature of an amorphous or semi-crystalline polymer so that it progresses through a flowable state (i.e., its rubber, rubbery flow, or liquid flow region of viscoelastic behavior, etc.), which leads to softening that permits flow wherein translation motion of entire molecules and diffusion is enabled and the thermoplastic can become displaced. For a crystalline polymer, this same behavior is achieved beyond the melting temperature. This substrate material in a flowable state (i.e., its rubber, rubbery flow, or liquid flow region of viscoelastic behavior, etc.), along with pressure applied to the horn causes the materials to become joined. Specific to this invention, the vibrational (acoustical) energy and pressure is applied directly to a wire, wire mesh, or other filament (any of which act as an energy director) to cause local frictional heating of the thermoplastic substrate material to a flowable state (i.e., its rubber, rubbery flow, or liquid flow region of viscoelastic behavior, etc.) and allow the wire, wire mesh, or other filament under pressure to become secured in place within the substrate material as it cools to a temperature at which it is no longer flowable.

While the use of acoustical energy in the ultrasonic frequency range to generate frictional heat for the embedding process represents a preferred embodiment, the application of heat energy and pressure to the filament or filament mesh during the embedding process has also been shown to be effective and can be therefore also employed in an another example embodiment. Rather than utilize frictional heating, the heat energy approach requires that the filament or filament mesh be heated to a temperature beyond that necessary to cause the substrate material to reach a flowable state (i.e., its rubber, rubbery flow, or liquid flow region of viscoelastic behavior, etc.). This heat is generated either by Joule heating induced by intense time-varying magnetic fields as with induction heating or induction melting equipment, by conduction heating as with resistance soldering equipment, by Joule heating caused by passing a sufficient electrical current through the filament or filament mesh, by forced convection heating as with hot air reflow soldering systems, or with radiant infrared heating as with infrared reflow soldering systems. Heat is then conducted from the filament or filament mesh to the substrate material, causing it to rapidly reach a flowable state (i.e., its rubber, rubbery flow, or liquid flow region of viscoelastic behavior, etc.) allowing the substrate material to be displaced as pressure is applied to achieve sufficient embedding whereby the filament or filament mesh is secured within the substrate material as it cools to a temperature at which it is no longer flowable. To minimize the amount of energy required to embed the mesh, the layer of substrate material can be made porous by modifying the spatial deposition of the polymer material via the slicing software. For example, using the software that prepares the build file for a material extrusion AM machine, the distance between material beads can be increased to increase the porosity of the substrate layer. The increased porosity would not only help reduce the amount of energy that is required to embed the mesh, but also reduce the amount of polymer material that could protrude above the surface.

These embedding processes are intended for application in a thermoplastic additive manufacturing process such as Fused Deposition Modeling (FDM) or other material extrusion additive manufacturing processes, Selective Laser Sintering (SLS) or other powder bed fusion additive manufacturing processes, laminated object manufacturing (LOM) or other sheet lamination additive manufacturing processes utilizing thermoplastic sheets, stereolithography or other vat photopolymerization additive manufacturing processes using photocurable thermoplastics, material jetting of photocurable thermoplastics, or other additive thermoplastic-based technologies yet to be developed for the creation of 3D structures, structural components, and 3D structural electronic, electromagnetic, or electromechanical systems or components.

In addition, an example embodiment can provide systems for making a three-dimensional structure, structural component, and/or 3D structural electronic, electromagnetic or electromechanical component/device that include a three-dimensional printing device and a first machine. The three-dimensional printing device creates one or more layers of a three-dimensional substrate by depositing a substrate material in a layer-by-layer fashion. The three-dimensional printing device can be a fused deposition modeling (FDM) machine or other material extrusion additive manufacturing processes, a selective laser sintering (SLS) machine or other powder bed fusion additive manufacturing processes, a laminated object manufacturing (LOM) machine or other sheet lamination additive manufacturing processes utilizing thermoplastic sheets, a stereolithography machine or other vat photopolymerization additive manufacturing processes utilizing photocurable thermoplastics, a material jetting machine utilizing photocurable thermoplastics, or other additive thermoplastic-based 3D printing machines yet to be developed. The first machine embeds at least a portion of a filament within a first layer of the substrate material such that the portion of the filament is substantially flush with a top surface of the first layer and a portion of the substrate material in a flowable state (i.e., its rubber, rubbery flow, or liquid flow region of viscoelastic behavior, etc.) is displaced by the portion of the filament and does not substantially protrude above the top surface of the first layer.

The first machine can be a wire-feed and cutting system, and one of a hollow ultrasonic horn, a solid ultrasonic horn or a rotary ultrasonic horn, or other suitable ultrasonic horn or sonotrode, as well as necessary power supplies and process control equipment.

In another embodiment of the present invention, the first machine can be a wire-feed and cutting system, and a filament or filament mesh heating device with fixturing to allow pressure to be applied to the filament or filament mesh during the embedding process and that includes any of the following: 1) An induction coil for inducing current and therefore Joule heating within the filament or filament mesh to be embedded; 2) Electrically resistive heating elements containing such materials as graphite, nickel chromium, or other electrically resistive materials, for generating and transferring heat to the filament or filament mesh by conduction; 3) Electrodes (electrical contacts) for the application of electrical current to at least a portion of the filament or filament mesh being embedded to generate Joule heating required for the embedding process; 4) An air heating and circulating device or system that rapidly heats at least a portion of a filament or mesh being embedded by forced convection heating; or 5) A radiant infrared heating source to rapidly heat at least a portion of the filament or mesh being embedded. The first machine would also include necessary power supplies and process control equipment.

The system may also include a second machine that creates one or more geometrical allowances (e.g., trenches, channels, cavities, etc.) within the top surface of the first layer, wherein the geometrical allowances reduce a volume of the substrate material to be displaced in a flowable state (i.e., its rubber, rubbery flow, or liquid flow region of viscoelastic behavior, etc.) and increase a surface area in contact with the portion of the filament prior to embedding the filament. Note that multiple process layers may have to be deposited to form the geometrical allowances of a single design layer. The portion of the filament is subsequently embedded within the one or more geometrical allowances. The one or more geometrical allowances can be one or more trenches, one or more channels or one or more cavities. Moreover, the one or more geometrical allowances can have cross sections that are circular shaped, square shaped, rectangular shaped, triangular shaped or may have any other suitable shape to the extent that the shape can be reasonably approximated with a layered AM process. The second machine can be a micro-machining machine, a CNC micro-machining machine, a CNC or conventional machining machine, a micro electrical discharge machining machine, an electrochemical machining machine, a direct write proton micro-machining machine, a laser ablation machine, a radiative source, an ultrasonic cutting machine, a hot wire cutting machine, a waterjet machine, an etching machine, a deep reactive ion etching machine, a plasma etching machine, a crystal orientation dependent etching machine, a wet bulk micromachining machine, a UV-lithography or X-ray lithography (LIGA) machine, a hot embossing lithography machine, a precision mechanical sawing machine, a chemically assisted ion milling machine, a sand blasting machine or a cutting machine.

The system may also include a component placement machine that places at least a first component on or within the first layer, wherein the filament is a conductive material, a first end of the filament is proximate to the first component, and a third machine that attaches the first end of the filament to the first component. The third machine can be a laser micro-welding machine, a resistance welding machine, an ultrasonic welding machine, a wire bonding machine, a solder machine or any attachment machine or device well known by those skilled in the art. In addition, the system may include a slide, a conveyor or a robotic device that transports the three-dimensional substrate to each machine. Note that all of the machines can be integrated into a single machine or may be operated as separate processes.

A system as described in U.S. patent application Ser. No. 13/343,651, which is incorporated by reference in its entirety, can be modified based on the present disclosure to implement the present invention.

The embedding may be accomplished in several ways. Each method of embedding will require: 1) a means of feeding the wire, wire mesh, or other filament to the desired location for embedding; and 2) a means of cutting the wire, wire mesh, or other filament during various steps of the process; 3) a means of joining the wires or mesh to other conductors, thermal components, mechanical components, electrical components, or electromechanical components); and 4) a means of connecting wires or wire mesh between layers in a 3D electronics device. Wire and filament handling may be accomplished through an automated wire-feed and cutting system (commercially available or custom hardware). Wire mesh may be precut to specific patterns based on design requirements or may be dispensed in a ribbon form to the desired embedding location. Motion control systems such as gantries, stages, pneumatic or linear actuators, or robotic arms will be used to position the ultrasonic horn, the filament or filament mesh heating device, wire handling system, and thermoplastic substrate during the embedding process. In certain cases, it may be necessary to manually place the wire, wire mesh, or other filament prior to embedding.

For embedding a single wire or filament, a hollow ultrasonic horn (sonotrode) with an entry point for the wire or filament can be used for the process. FIGS. 2A and 2B are images showing a hollow ultrasonic horn (sonotrode) used to embed a filament in a substrate in accordance with one embodiment of the present invention. Alternatively, a solid ultrasonic horn that has been shaped or contoured to facilitate the wire embedding process may be used. FIG. 2C shows a solid ultrasonic horn (sonotrode) used to embed a filament in a substrate in accordance with one embodiment of the present invention.

Rotary horns or sonotrodes, which see wide-spread use in the textiles industry for joining fabrics that contain synthetic materials, can also be applied to the ultrasonic embedding of wires and filaments. FIGS. 3A and 3B are images showing a rotary ultrasonic horn used to embed a filament in a substrate in accordance with another embodiment of the present invention.

In order to allow subsequent layers to be built above the embedded wiring, the surface and wire together must be maintained in a dimensionally compliant state (i.e. flush), meaning that the wire must be sufficiently embedded and a portion of the substrate material in a flowable state (i.e., its rubber, rubbery flow, or liquid flow region of viscoelastic behavior, etc.) must be controlled so as not to protrude above the surface to an extent that it inhibits the continued layer by layer build process. Alternatively, the wire does not have to be sufficiently embedded to prevent all protrusions (wire and/or substrate material) if the process is capable of detecting and accommodating the protrusions by modifying the layers deposited above the protrusions. FIG. 4 is an image showing a cross section of filaments embedded within a substrate in which the filaments are substantially flush with a top surface of the layer and a portion of the substrate material in a flowable state (i.e., its rubber, rubbery flow, or liquid flow region of viscoelastic behavior, etc.) is displaced by the portion of the filament and does not substantially protrude above the top surface of the layer.

The present invention allows filaments to be embedded in irregularly-shaped surfaces or curved surfaces as shown in FIG. 5.

The embedding of wire mesh offers benefits not seen in other 3D electronics fabrication processes. Prior to the current invention, 3D electronics systems or components created with additive manufacturing processes were limited in application due to the lack of integral conductive planes and/or electromagnetic shielding. As a result, such systems or components were subject to the ill effects of electrical noise and electromagnetic interference (EMI). Additionally, the lack of conductive planes required extra routings for power and ground connections to each electrical component where needed, causing further susceptibility to electrical noise and cross-talk, and resulting in excessive design work and fabrication time. Embedded wire mesh offers solutions to each of these problems. Wire mesh has seen widespread use in shielding applications and has been shown to be effective at frequencies as high as 10 GHz, allowing a much greater number of radio frequency applications than was possible in 3D electronics fabricated with additive manufacturing prior to the current invention. Since wire mesh can be embedded as desired within a layered process as well as on the exterior surface of a 3D electronics component, device, or system, shielding and conductive planes for connection to power and ground can be made available where needed, allowing simplified design and more rapid fabrication. It has also been noted that embedded wire mesh forms an extremely strong bond with the thermoplastic substrate and therefore can be used to create a polymer-metal composite to strengthen the additively produced component, device, or system. AM-produced parts have historically exhibited a mechanical properties (i.e., tensile, compressive, impact, flexural, creep, and fatigue) gap when compared to injection molded parts that have limited the applications of AM-produced parts to prototypes. Ahn et al. reported that ABS parts produced using fused deposition modeling (FDM) showed ultimate tensile strengths equal to 10-73% of injection molded parts. Using the present invention, filaments and meshes (conductive and non-conductive) can be used to strengthen regions within a layer or across multiple layers. Preliminary results have shown that the present invention using plain steel mesh can increase the ultimate tensile strength of FDM-produced parts by 37%. Further improvements are expected with the use of mesh made from mechanically robust materials (i.e., stainless steel, copper chromium alloys) and multiple meshes within the same polymer part. Additionally, prior to embedding, the filament or mesh can be preloaded and embedded in such a state so as to produce a pre-stressed polymer-composite structure with enhanced mechanical properties and predictable/controllable deflections. It should also be noted that the embedding of nonconductive meshes made with materials such as Kevlar can provide improvements not only in strength, but in strength to weight ratio, providing benefits to lightweight applications.

Ultrasonically embedding wire mesh may be accomplished in several ways. A rotary horn enables the embedding of wire mesh on flat as well as curved substrates as shown in FIGS. 6A and 6B. In addition, the mesh can be embedded within a substrate wherein a portion of the mesh is disposed within a cavity and subsequently attached to a conductor in the previous layer using laser micro-welding, resistance welding, ultrasonic welding, soldering, wire bonding, or any attachment process well known by those skilled in the art as shown in FIG. 7.

FIGS. 8A-8D are images showing a progression of ultrasonically embedded wire mesh in a polycarbonate substrate produced with Fused Deposition Modeling (FDM). The mesh shown here is stainless steel, although the process is applicable to other materials such as, but not limited to, copper, aluminum, brass, steel, copper chromium alloy, and copper-nickel alloy. The method has also been successfully used with non-conductive meshes and fibers.

Certain electrical or mechanical design requirements may necessitate the use of pre-cut wire mesh patterns. These mesh patterns may be embedded with rotary horns or with solid horns. FIGS. 9A-9C show the progression of a mesh pattern being embedded in a flat substrate using a solid square horn. In this case, a pre-cut pattern is placed where desired, the ultrasonic horn is actuated causing the wire mesh pattern to be embedded, and finally, the horn is lifted from the surface to complete the process.

It should be noted that comparable results for each example of (conductive) mesh embedding can be obtained by using heat energy sources as described herein along with appropriate fixturing/tooling as an alternative to ultrasonic horns or sonotrodes, thereby representing a further embodiment of the present invention.

Figure 10:
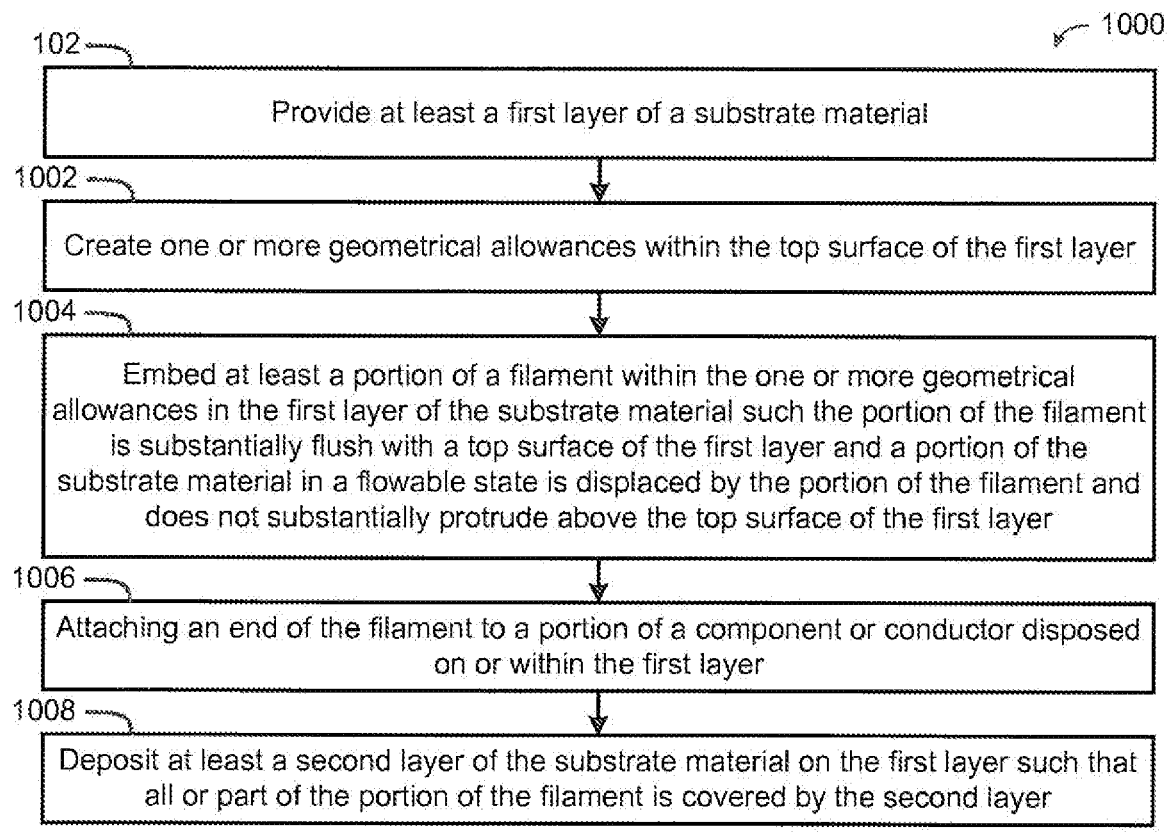
FIG. 10 is a flow chart of a method for embedding a filament in a three-dimensional electronic, electromagnetic or electromechanical component/device in accordance with one embodiment of the present invention.
Figure 11A:
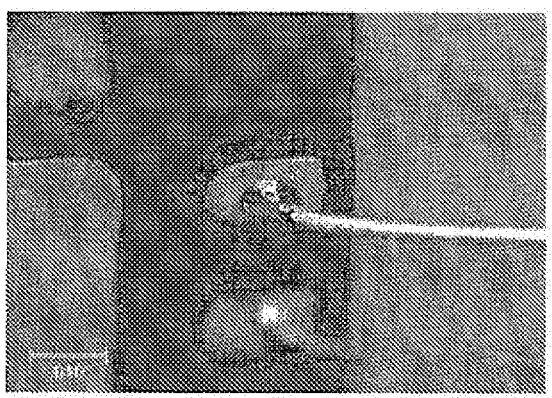
FIGS. 11A-11D are images of conductive wire laser micro-welded to electronic components in accordance with one embodiment of the present invention.
Figure 11B:
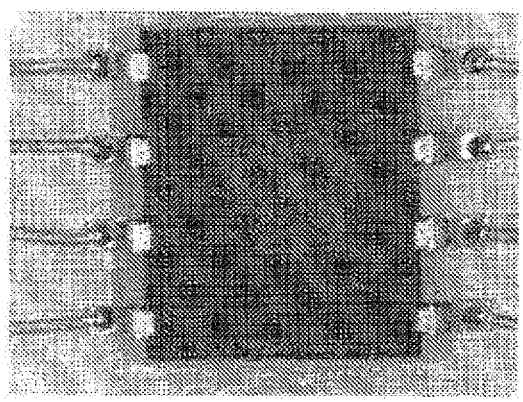
Figure 11C:
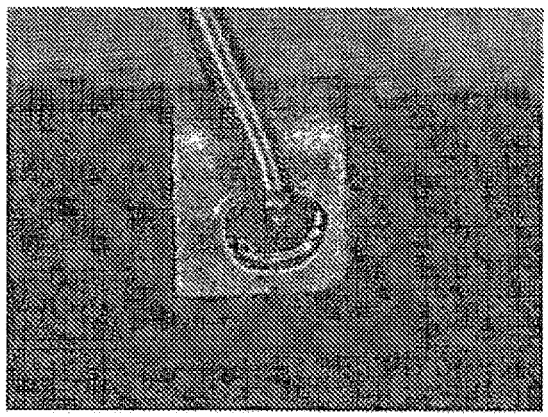
Figure 11D:
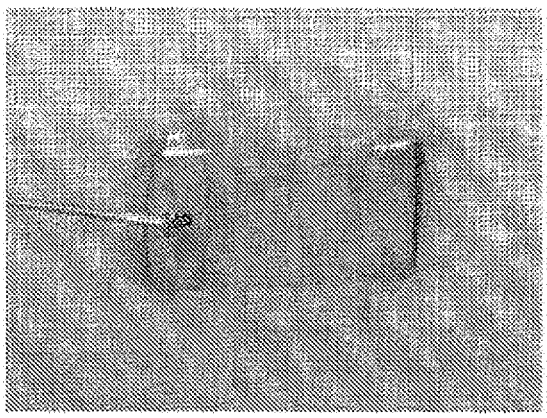

Now referring to FIG. 10, a flow chart of a method 1000 for embedding a filament in a three-dimensional electronic, electromagnetic or electromechanical component/device in accordance with one embodiment of the present invention is shown. A first layer of a substrate material is provided in block 102. One or more geometrical allowances are created within the top surface of the first layer in block 1002. The geometrical allowances reduce the volume of displaced substrate material in a flowable state (i.e., its rubber, rubbery flow, or liquid flow region of viscoelastic behavior, etc.) and increases the surface area in contact with the portion of the filament prior to embedding the filament, requiring less energy to achieve sufficient embedding, whereby the filament is held securely in place in the substrate and is substantially flush with the top surface of the substrate. Alternatively, the wire does not have to be sufficiently embedded to prevent all protrusions (wire and/or substrate material) if the process is capable of detecting and accommodating the protrusions by modifying the layers deposited above the protrusions. The one or more geometrical allowances can be one or more trenches, one or more channels or one or more cavities. Note that multiple process layers may have to be deposited to form the geometrical allowances of a single design layer. Moreover, the one or more geometrical allowances can have cross sections that are circular shaped, square shaped, rectangular shaped, triangular shaped or may have any other suitable shape to the extent that the shape can be reasonably approximated with a layered AM process. At least a portion of a filament is embedded within the one or more geometrical allowances in the first layer of the substrate material such that the portion of the filament is substantially flush with a top surface of the first layer and a portion of the substrate material in a flowable state (i.e., its rubber, rubbery flow, or liquid flow region of viscoelastic behavior, etc.) is displaced by the portion of the filament and does not substantially protrude above the top surface of the first layer in block 1004. An end of the filament is placed proximate to a component or conductor and the end of the filament is attached to the component or conductor in block 1006. The first end of the filament is attached to the first component or conductor using a laser micro-welding process, a resistance welding process, an ultrasonic welding process, a wire bonding process, a solder process, or any attachment process well known by those skilled in the art. In some embodiments, the first layer may also include at least a second component or conductor disposed on or within the first layer wherein the second end of the filament is proximate to the second component or conductor. The second end of the filament is then attached to the second component or conductor. At least a second layer of the substrate material is deposited on the first layer such that all or part of the portion of the filament is covered by the second layer in block 1008.

The component or conductor can be an electronic component, an electrostatic component, a pneumatic component, an electroacoustic component, a Micro-Electro-Mechanical system (MEMS), a biomedical component, an electrochemical component, an electromechanical component, an electromagnetic component, a mechanical component, a metamaterial component, an optical component, a photonic component, a thermal component, a thermal management component, a mesh, an embedded conductor, a wire, a conductive pad, a conductive terminal, a conductive trace, a via to another layer or a connector. The electronic component can be an integrated circuit, a resistor, a capacitor, an inductor, a transistor, a thermistor, a thyristor, a sensor, a processor, a memory, an interface device, a display, a power source, an energy conversion device or an antenna. The electronic component can be placed by hand or using a component placement machine, wherein the component placement machine comprises a pick and place machine, a robotic process or other automated component placement technology.

This method can be used to make a three-dimensional structure or electronic, electromagnetic or electromechanical component/device. Moreover, this method can be implemented as a computer program embodied on a non-transitory computer readable medium wherein the steps are preformed using one or more code segments.

Although many methods may be used for joining the embedded wires and wire mesh to each other and to electrical components, the preferred method is with laser micro-welding. State of the art green laser systems offer the ability to effectively weld a range of wire size and are especially effective for welding 'red' metals such as copper and gold. One such system is offered by Miyachi Unitek Corporation. The green laser technology has shown effective use in a variety of micro-weld applications involving electronics.

FIGS. 11A-11D are images of conductive wire laser micro-welded to electronic components in accordance with one embodiment of the present invention.

Experimentation has shown that this laser micro-welding system can effectively weld copper wire to a wide range of surface mount electrical components. As part of a feasibility study, several components were laser welded with copper wire of various gauges. The results show that the system can be adapted to provide acceptable electrical and mechanical connection to the majority of available electronic components. The method provides a non-contact joining method, which eliminates the need for filler materials such as solder, conductive epoxies, or conductive inks. The process also creates a minimal heat-affected zone, resulting in virtually no thermal shock to sensitive electronic components and sensors. Since the resulting welds are autogenous (meaning they are formed solely from the two metal parts being welded, and with no filler material), the welds are inherently stronger than soldered connections. FIGS. 19A and 19B are images showing a progression of attaching the filaments to a component in accordance with another embodiment of the present invention.

FIGS. 12A-12B are images of plain steel mesh being embedded into FDM-built ABS parts (Standard ASTM D638 type I test specimens) using an ultrasonic horn (horn on left focused to a small working surface area (~130 mm$^2$), and horn on right focused to a larger surface area (~1450 mm$^2$)) in accordance with one embodiment of the present invention.

FIGS. 13A-13B are images of embedded plain steel meshes in FDM-built ABS parts (Standard ASTM D638 type I test specimens) in accordance with one embodiment of the present invention.

FIG. 14 is an image of ABS material being deposited over embedded plain steel mesh using FDM technology to produce a polymer-mesh composite in accordance with one embodiment of the present invention.

FIGS. 15A-15B are images of plain steel mesh embedded into FDM-built ABS parts (Standard ASTM D638 type I test specimens) in accordance with one embodiment of the present invention. One layer of ABS deposited on steel mesh (general view on left, optical microscope image on right).

FIGS. 16A-16B are images of polymer-mesh composite structure made by embedding a plain steel mesh into an FDM-built ABS part (Standard ASTM D638 type I test specimen, isometric and side views) in accordance with one embodiment of the present invention.

FIG. 17 is an image of ultrasonic wire embedding process in accordance with one embodiment of the present invention.

FIGS. 18A-18B are images of plain steel mesh embedded into PVC part that was built using a sheet lamination additive manufacturing process (general view on left, top view on right) in accordance with one embodiment of the present invention.

FIG. 20 is an image showing various layers of a 3D device in accordance with another embodiment of the present invention.

With systems for embedding conductive wire and wire mesh in 3D electronics, a method of creating connections between layers in the additive manufacturing process becomes necessary. The 'keyhole' via is proposed as a solution to this problem. The name 'keyhole' arrives from the geometry used in the method. FIGS. 22A-22K show the steps involved in creating this inter-layer connection. Inter-layer connections formed in this way are preferred over using conductive epoxies due to superior connection strength and the conductivity of bulk copper, which is, at the present time unachievable with conductive epoxies or inks. The natural strain relief loop that is formed in the process will ensure reliability of the connection during mechanical shock and vibration. The keyhole process maintains a compliant (or flush) surface, allowing the continued layered application of substrate material and the complete embedding of electronic circuits.

Figure 21:
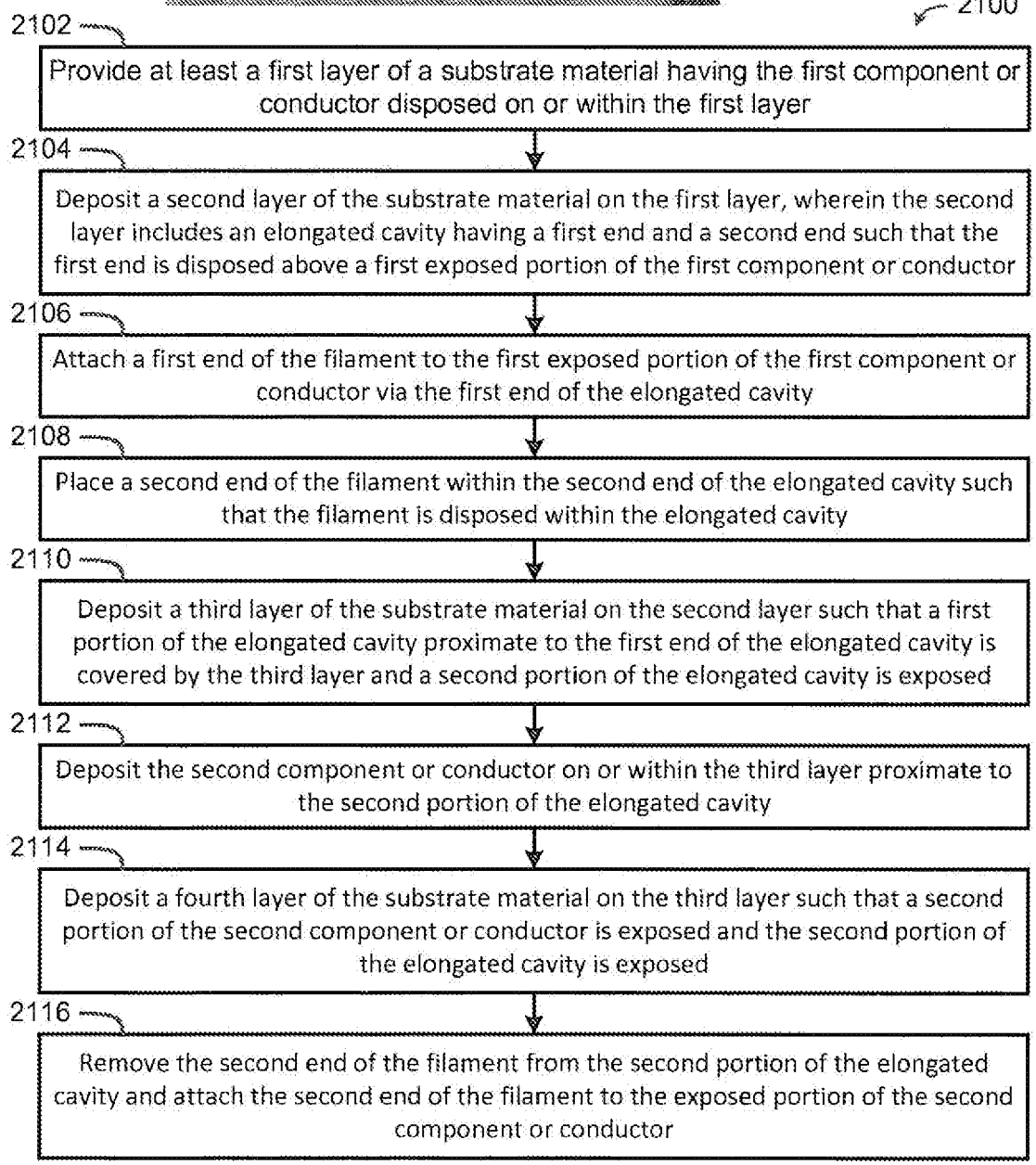
FIG. 21 is a flow chart of a method for connecting a first component or conductor to a second component or conductor in a three-dimensional electronic, electromagnetic or electromechanical component/device in accordance with one embodiment of the present invention.
Figure 25B:
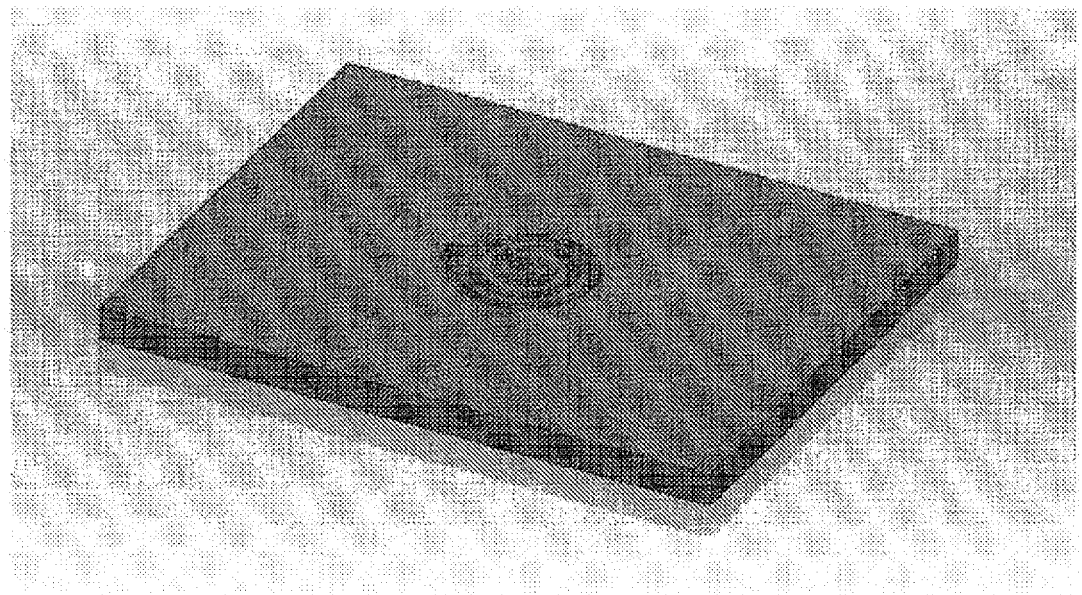
Figure 25C:
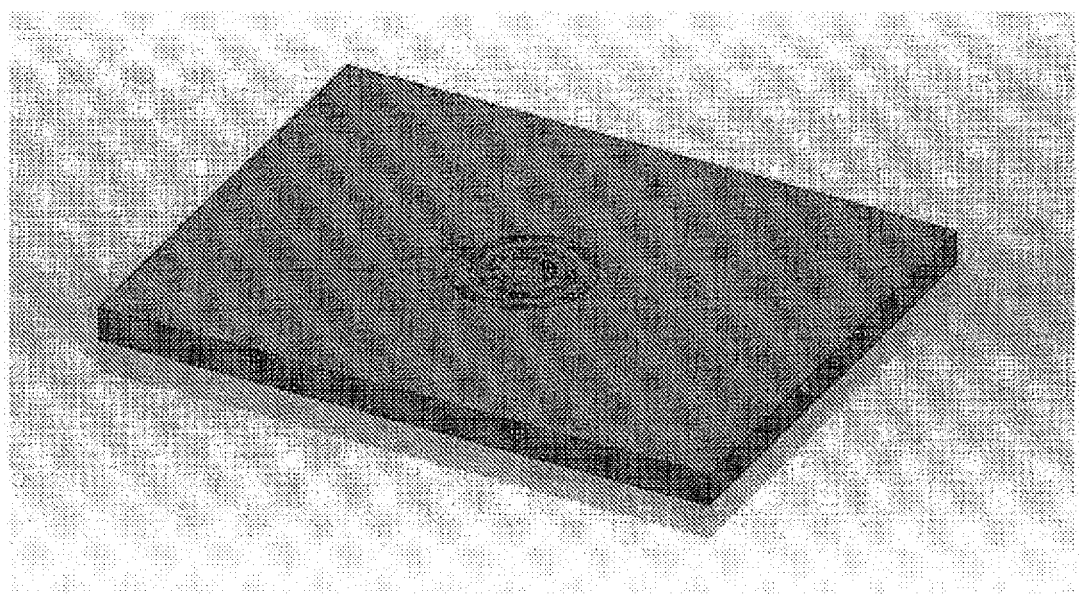
Figure 25D:
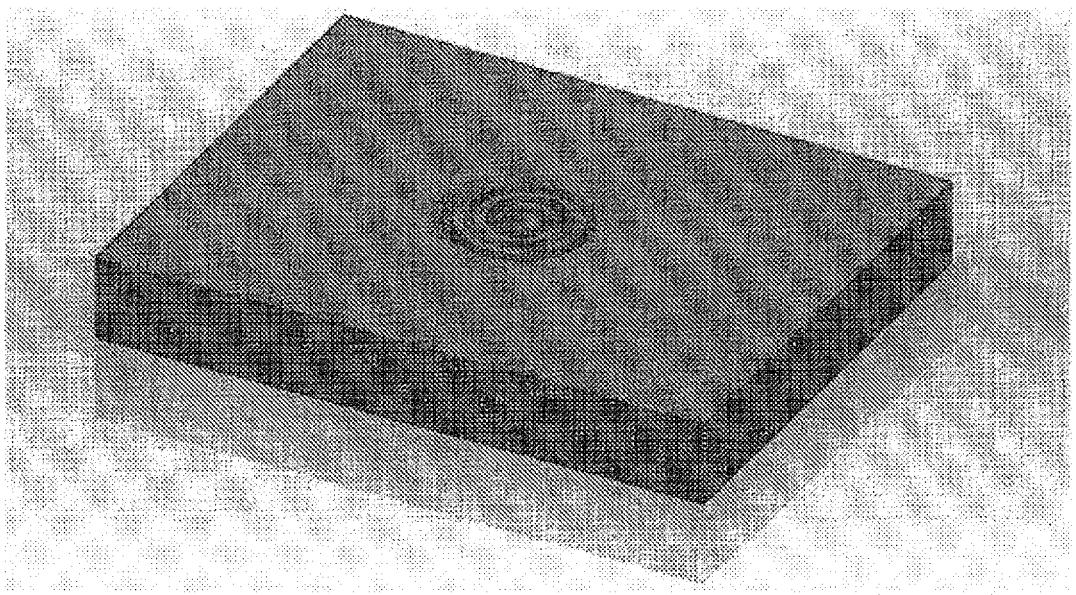
Figure 25E:
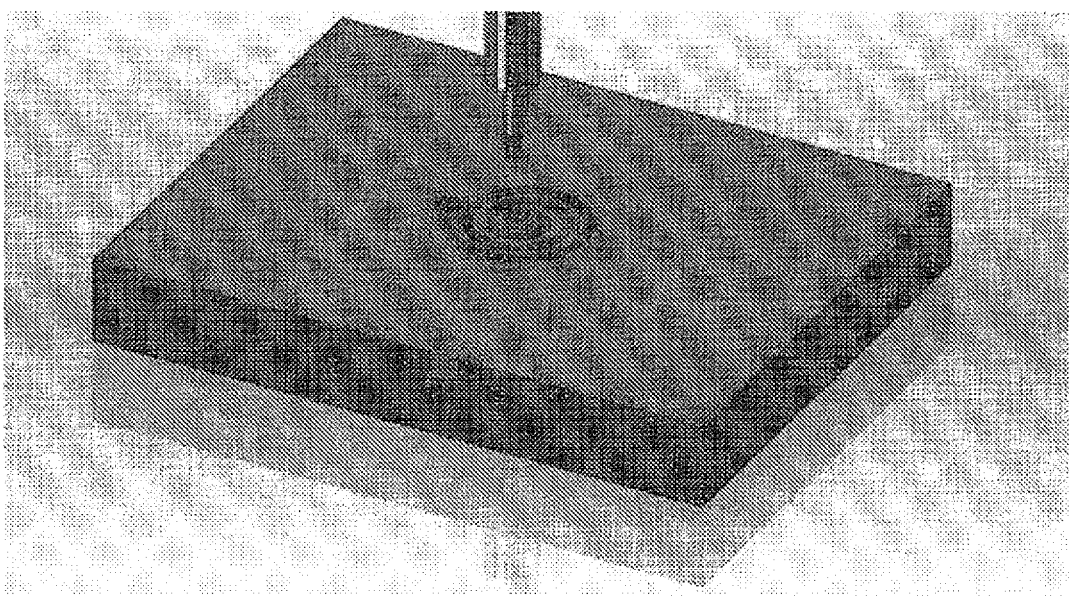
Figure 25F:
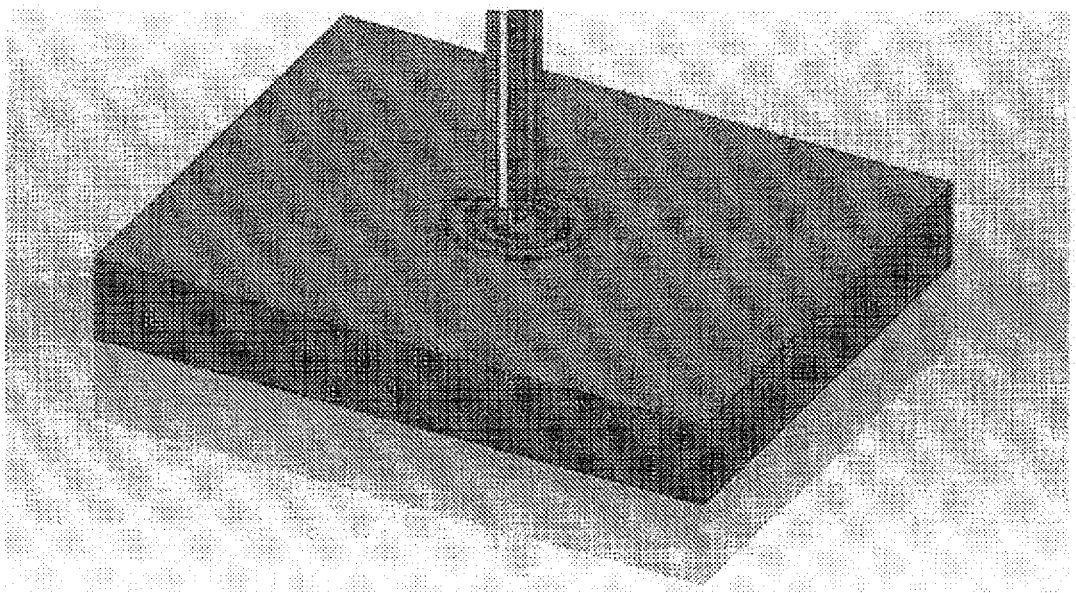
Figure 25G:
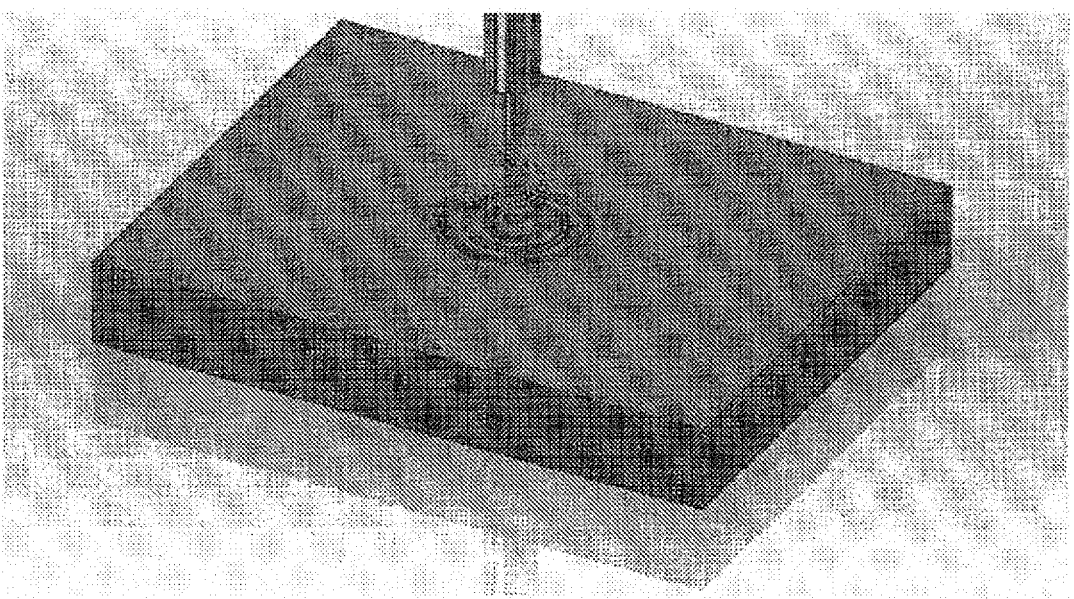
Figure 26B:
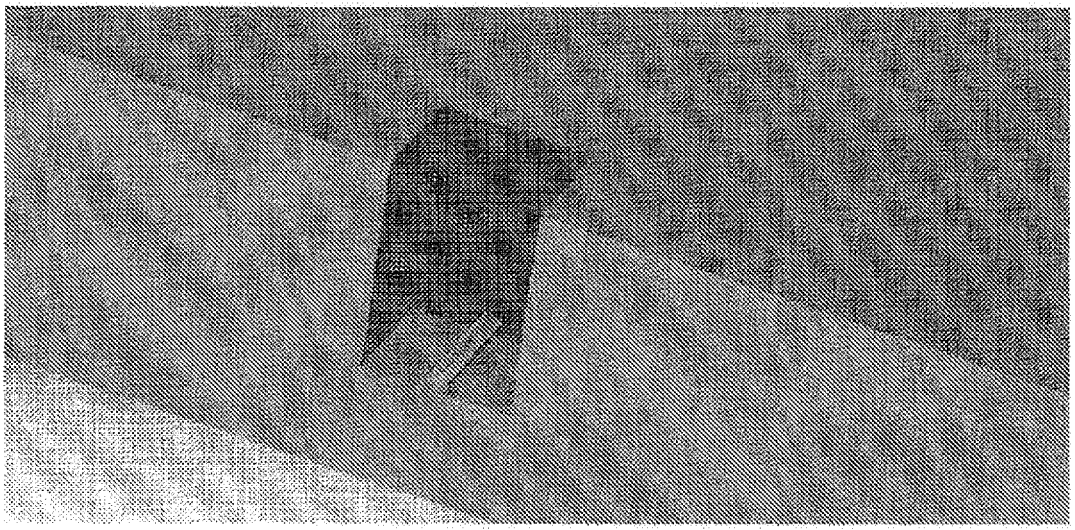
Figure 26C:
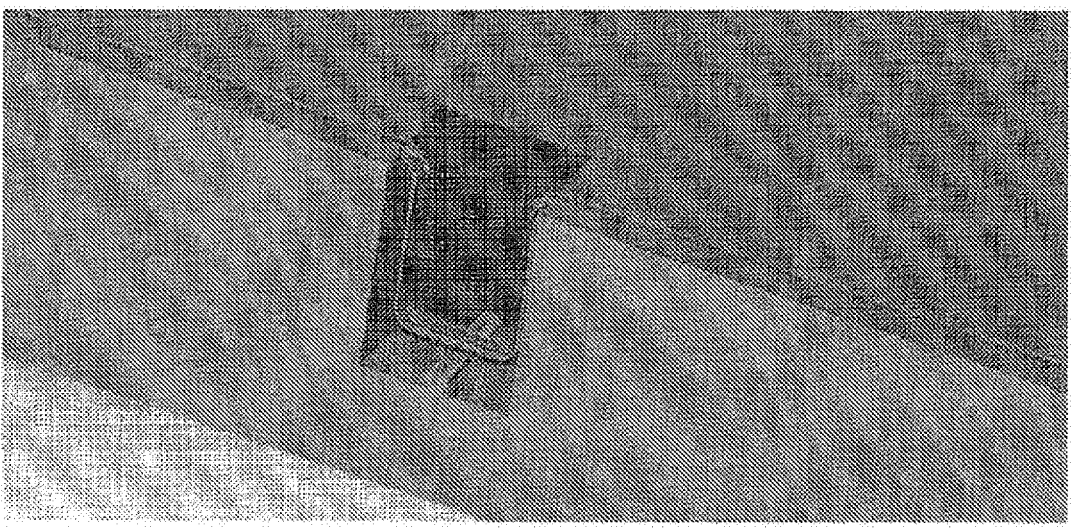
Figure 26D:
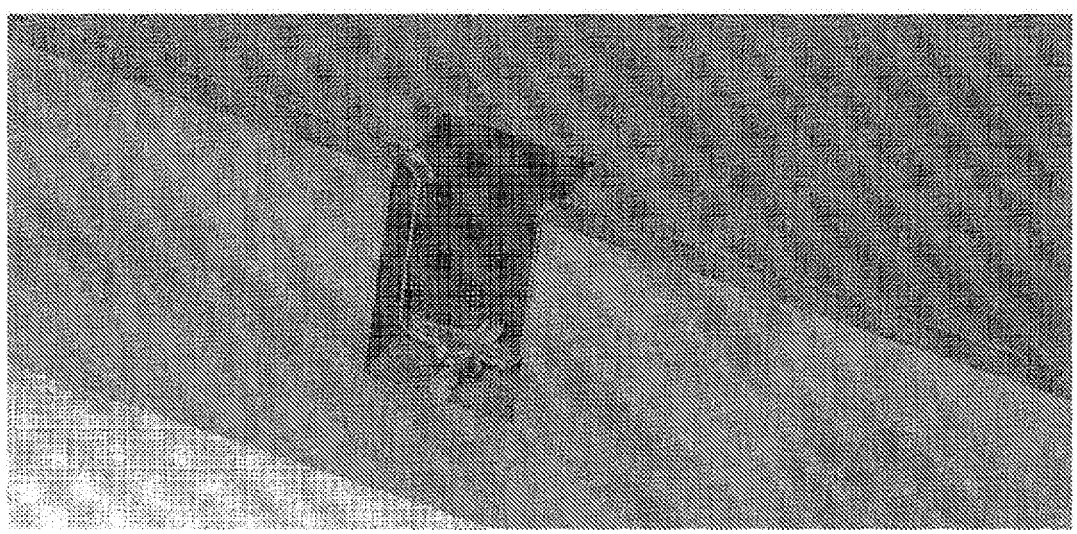

Now referring to FIG. 21, a flow chart of a method 2100 for connecting a first component or conductor to a second component or conductor in a three-dimensional electronic, electromagnetic or electromechanical component/device in accordance with one embodiment of the present invention is shown. At least a first layer of a substrate material having the first component or conductor disposed on or within the first layer is provided in block 2102. A second layer of the substrate material is deposited on the first layer in block 2104. The second layer includes an elongated cavity having a first end and a second end such that the first end is disposed above a first exposed portion of the first component or conductor. A first end of the filament is attached to the first exposed portion of the first component or conductor via the first end of the elongated cavity in block 2106. The attachment is made by a laser micro-welding process, a resistance welding process, an ultrasonic welding process, a soldering process, a wire bond process, or any attachment process well known by those skilled in the art. A second end of the filament is placed within the second end of the elongated cavity such that the filament is disposed within the elongated cavity in block 2108. A third layer of the substrate material is deposited on the second layer such that a first portion of the elongated cavity proximate to the first end of the elongated cavity is covered by the third layer and a second portion of the elongated cavity is exposed in block 2110. The second component or conductor is deposited on or within the third layer proximate to the second portion of the elongated cavity in block 2112. A fourth layer of the substrate material is deposited on the third layer such that a second portion of the second component or conductor is exposed and the second portion of the elongated cavity is exposed in block 2114. The second end of the filament is removed from the second portion of the elongated cavity and attached to the exposed portion of the second component or conductor in block 2116. The attachment is made by a laser micro-welding process, a resistance welding process, an ultrasonic welding process, a soldering process, a wire bond process, or any attachment process well known by those skilled in the art. Note that while the process described herein is specific to connecting conductors and(or) components between multiple design layers within the three-dimensional electronic, electromagnetic, or electromechanical component/device, it should be understood that the present invention also provides for the interconnection of multiple components within the same design layer. This method can be used to make a three-dimensional electronic, electromagnetic or electromechanical component/device. Moreover, this method can be implemented as a computer program embodied on a non-transitory computer readable medium wherein the steps are preformed using one or more code segments.

In addition, the present invention provides systems for making a three-dimensional electronic, electromagnetic or electromechanical component/device that includes a three-dimensional printing device, a first machine and a second machine. The three-dimensional printing device creates a first layer of the substrate material. The first machine places a first component or conductor on or within the first layer. The three-dimensional printing machine deposits a second layer of the substrate material on the first layer, wherein the second layer includes an elongated cavity having a first end and a second end such that the first end is disposed above a first exposed portion of the first component or conductor. The first machine attaches a first end of a filament to the first exposed portion of the first component or conductor via the first end of the elongated cavity. The attachment is by a laser welding process, a resistance welding process, an ultrasonic welding process, a soldering process, a wire bond process, or any attachment process well known by those skilled in the art. The second machine places a second end of the filament within the second end of the elongated cavity such that the filament is disposed within the elongated cavity. The three-dimensional printing device deposits a third layer of the substrate material on the second layer such that a first portion of the elongated cavity proximate to the first end of the elongated cavity is covered by the third layer and a second portion of the elongated cavity is exposed. The second machine places the second component or conductor on or within the third layer proximate to the second portion of the elongated cavity. The three-dimensional printing device deposits a fourth layer of the substrate material on the third layer such that a second portion of the second component or conductor is exposed and the second portion of the elongated cavity is exposed. The second machine removes the second end of the filament from the second portion of the elongated cavity and places the second end of the filament proximate to the exposed portion of the second component or conductor. The first machine attaches the second end of the filament to the exposed portion of the second component or conductor. The attachment is by a laser micro-welding process, a resistance welding process, an ultrasonic welding process, a soldering process, a wire bond process, or any attachment process well known by those skilled in the art. Note that while the process described herein is specific to connecting conductors and(or) components between multiple design layers within the three-dimensional electronic, electromagnetic, or electromechanical component/device, it should be understood that the present invention also provides for the interconnection of multiple components within the same design layer.

FIGS. 22A-22K are images showing a progression of creating an inter-layer connection in accordance with another embodiment of the present invention.

FIGS. 23A-23G are images showing another progression of creating an inter-layer connection using a wire mesh plane (as with multiple power or ground connections) in accordance with another embodiment of the present invention.

FIGS. 24A-24G are images showing another progression of creating an inter-layer connection in accordance with another embodiment of the present invention.

FIGS. 25A-25H are images showing another progression of creating an inter-layer connection in accordance with another embodiment of the present invention. A first conductor is embedded in the substrate in FIG. 25A. Additional substrate layers are added with spiral allowance (or relief) in FIG. 25B. A second conductor is placed in the spiral relief and attached to the first conductor in FIG. 25C. Additional substrate layers are added in FIG. 25D. Tooling is moved in place over the relief in FIG. 25E and the tooling is lowered into the relief in FIG. 25F. The tooling extracts the loose end of the second conductor from the relief in FIG. 25G and the loose end of the second conductor is embedded in the top layer of the substrate and attached as desired in FIG. 25H.

FIGS. 26A-26D are images showing another progression of creating an inter-layer connection in accordance with another embodiment of the present invention. A first conductor is embedded in FIG. 26A wherein a relief is present. Additional layers of substrate are added in FIG. 26B. A second conductor is embedded in the top substrate layer and is placed in the relief in contact with the first conductor in FIG. 26C. The second conductor is attached to the first conductor in FIG. 26D.

The combinations of technologies described herein represent the ability to produce high reliability functional electronic, electromagnetic, and electromechanical systems capable of operating in adverse field conditions and environments. Additionally, the embedded filaments or meshes produce a composite capable of improving the mechanical properties of AM-fabricated parts, structures, or structural components, enabling their use for more than just prototypes. The materials available for thermoplastic-based additive manufacturing processes are compatible with space and marine applications as well as demanding applications on land. The ability to fully embed electronics in the substrate material can provide submersible systems as well as the intrinsic safety required for operation in explosive or volatile chemical environments. Products expected to be produced with this technology include small satellite systems, compact military hardware, bio-implantable devices, marine sensors, unmanned aerial vehicles (UAVs), vehicle components and more.

As previously mentioned, parts produced by this invention will be used in various applications including but not limited to: 1) unmanned aerial systems (UASs) and unmaned aerial vehicles (UAVs) by providing aerodynamic parts with embedded sensors, communications and electronics within structural components or by directly fabricating onto UAS and UAV surfaces; 2) customized, mission-specific and possibly disposable electronics; 3) truly 3D antennas and photonic devices that improve communications; 4) replacement components for multiple electronic systems on a naval vessel as well as other defense, commercial, and biomedical applications; 5) custom fit sailor-borne or soldier-born electronics and communications systems; 6) disposable floating depth-specific sensor systems; 7) biomedical devices; and 8) metamaterial structures.

It may be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications, patents and patent applications mentioned in the specification are indicative of the level of skill of those skilled in the art to which this invention pertains. All publications, patents and patent applications are herein incorporated by reference to the same extent as if each individual publication, patent or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it may be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A system for making a three-dimensional electronic or electromechanical device, said system comprising:
a three-dimensional printer configured to create a three-dimensional thermoplastic substrate of said electronic or electromechanical device by depositing a thermoplastic substrate material in a layer-by-layer fashion; and
a first machine comprising a wire-feed and cutting system and at least one energy source, the energy source comprising a rotary ultrasonic horn or rotary sonotrode, wherein the first machine is configured to heat the thermoplastic substrate to a flowable state and embed at least a portion of a filament or a filament mesh within a layer of the thermoplastic substrate material such that said portion of said filament or said filament mesh is flush with a top surface of the layer and a portion of the thermoplastic substrate material in the flowable state is displaced by the portion of the filament or said filament mesh and wherein said portion of said filament or said filament mesh that displaces said substrate material does not protrude above the top surface of the layer, and wherein said filament or said filament mesh comprises a solid conductor.

2. The system as recited in claim 1, wherein:
the three-dimensional printer comprises a fused deposition modeling (FDM) machine or other extrusion-based additive manufacturing machine, a selective laser sintering (SLS) machine or other powder bed fusion additive manufacturing process, a sheet lamination additive manufacturing process utilizing thermoplastic sheets, a stereolithography machine or other vat photopolymerization additive manufacturing process utilizing photocurable thermoplastics, a material jetting machine utilizing photocurable thermoplastics, or other additive thermoplastic-based 3D printing machine.

3. The system as recited in claim 2, wherein the three-dimensional printer further deposits at least an additional layer of the thermoplastic substrate material such that all or a part of the portion of the filament or said filament mesh is covered by the additional layer.

4. The system as recited in claim 1, further comprising:
a component placement machine configured to place a first component on or within the layer;
a first end of the filament or said filament mesh is proximate to the first component; and
a third machine configured to attach the first end of the filament or said filament mesh to the first component.

5. The system as recited in claim 4, wherein the third machine comprises a laser micro-welding machine.

6. The system as recited in claim 4 wherein the third machine comprises a resistance welding machine.

7. The system as recited in claim 4 wherein the third machine comprises an ultrasonic welding machine.

8. The system as recited in claim 4 wherein the third machine comprises a wire bonding machine.

9. The system as recited in claim 1 wherein the three-dimensional printer comprises a fused deposition modeling (FDM) machine and wherein the filament or said filament mesh comprises at least one of a conductive plane, a mechanical reinforcement and an electromagnetic shield.

10. The system as recited in claim 1 wherein the three-dimensional printer comprises a selective laser sintering (SLS) machine and wherein the filament or said filament mesh comprises at least one of a conductive plane, a mechanical reinforcement and an electromagnetic shield.

11. The system as recited in claim 1 wherein the three-dimensional printer implements a powder bed fusion additive manufacturing process and wherein the filament or said filament mesh comprises at least one of a conductive plane, a mechanical reinforcement and an electromagnetic shield.

12. The system as recited in claim 1 wherein the three-dimensional printer comprises a stereolithography machine that utilizes stereolithography, which includes a fabrication process in which a laser is used to cure a photocurable polymer resin to fabricate substrates.

13. The system as recited in claim 1 wherein the three-dimensional printer comprises an additive thermoplastic-based 3D printing machine and wherein the filament or said filament mesh comprises at least one of, a conductive plane, a mechanical reinforcement and an electromagnetic shield.

14. The system as recited in claim 1 further comprising a second machine configured to create a geometrical allowance within the top surface of the layer, wherein the geometrical allowance reduces a volume of the thermoplastic substrate material to be displaced in the flowable state and increases a surface area in contact with the portion of the filament prior to embedding the filament.

* * * * *